US 8,791,575 B2

(12) United States Patent
Oganesian et al.

(10) Patent No.: US 8,791,575 B2
(45) Date of Patent: Jul. 29, 2014

(54) MICROELECTRONIC ELEMENTS HAVING METALLIC PADS OVERLYING VIAS

(75) Inventors: Vage Oganesian, Palo Alto, CA (US); Ilyas Mohammed, Santa Clara, CA (US); Craig Mitchell, San Jose, CA (US); Belgacem Haba, Saratoga, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 384 days.

(21) Appl. No.: 12/842,717

(22) Filed: Jul. 23, 2010

(65) Prior Publication Data
US 2012/0018868 A1 Jan. 26, 2012

(51) Int. Cl.
*H01L 23/48* (2006.01)

(52) U.S. Cl.
USPC ............ 257/774; 257/E23.067; 257/E23.174; 257/E21.577; 438/637; 438/638

(58) Field of Classification Search
USPC ........... 257/774, E23.011, E23.067, E23.174, 257/E21.577, E21.578, E21.585; 438/637, 438/638, 639, 640
See application file for complete search history.

(56) References Cited

U.S. PATENT DOCUMENTS

| 4,074,342 A | 2/1978 | Honn et al. |
| 4,682,074 A | 7/1987 | Hoeberechts et al. |
| 4,765,864 A | 8/1988 | Holland et al. |
| 5,229,647 A | 7/1993 | Gnadinger |
| 5,322,816 A | 6/1994 | Pinter |
| 5,481,133 A | 1/1996 | Hsu |
| 5,686,762 A | 11/1997 | Langley |
| 5,700,735 A | 12/1997 | Shiue et al. |
| 5,703,408 A | 12/1997 | Ming-Tsung et al. |
| 5,808,874 A | 9/1998 | Smith |
| 6,005,466 A | 12/1999 | Pedder |

(Continued)

FOREIGN PATENT DOCUMENTS

| CN | 1490875 A | 4/2004 |
| CN | 1758430 A | 4/2006 |

(Continued)

OTHER PUBLICATIONS

David R. Lide et al: 'Handbook of Chemistry and Physics, 77th Edition, 1996-1997', Jan. 1, 1997, CRC Press, Boca Raton, New York, London, Tokyo, XP002670569, pp. 12-90-12-91.

(Continued)

*Primary Examiner* — Matthew Reames
*Assistant Examiner* — Farid Khan
(74) *Attorney, Agent, or Firm* — Lerner, David, Littenberg, Krumholz & Mentlik, LLP

(57) ABSTRACT

A microelectronic unit, an interconnection substrate, and a method of fabricating a microelectronic unit are disclosed. A microelectronic unit can include a semiconductor element having a plurality of active semiconductor devices therein, the semiconductor element having a first opening extending from a rear surface partially through the semiconductor element towards a front surface and at least one second opening, and a dielectric region overlying a surface of the semiconductor element in the first opening. The microelectronic unit can include at least one conductive interconnect electrically connected to a respective conductive via and extending away therefrom within the aperture. In a particular embodiment, at least one conductive interconnect can extend within the first opening and at least one second opening, the conductive interconnect being electrically connected with a conductive pad having a top surface exposed at the front surface of the semiconductor element.

29 Claims, 14 Drawing Sheets

(56) References Cited

U.S. PATENT DOCUMENTS

| | | | |
|---|---|---|---|
| 6,013,948 A | 1/2000 | Akram et al. | |
| 6,022,758 A | 2/2000 | Badehi | |
| 6,031,274 A | 2/2000 | Muramatsu et al. | |
| 6,103,552 A | 8/2000 | Lin | |
| 6,143,369 A | 11/2000 | Sugawa et al. | |
| 6,143,396 A | 11/2000 | Saran et al. | |
| 6,169,319 B1 | 1/2001 | Malinovich et al. | |
| 6,181,016 B1 | 1/2001 | Lin et al. | |
| 6,261,865 B1 | 7/2001 | Akram | |
| 6,277,669 B1 | 8/2001 | Kung et al. | |
| 6,284,563 B1 | 9/2001 | Fjelstad | |
| 6,313,024 B1 * | 11/2001 | Cave et al. | 438/598 |
| 6,313,540 B1 | 11/2001 | Kida et al. | |
| 6,362,529 B1 | 3/2002 | Sumikawa et al. | |
| 6,368,410 B1 | 4/2002 | Gorczyca et al. | |
| 6,399,892 B1 | 6/2002 | Milkovich et al. | |
| 6,472,247 B1 | 10/2002 | Andoh et al. | |
| 6,492,201 B1 | 12/2002 | Haba | |
| 6,498,381 B2 | 12/2002 | Halahan et al. | |
| 6,498,387 B1 | 12/2002 | Yang | |
| 6,507,113 B1 | 1/2003 | Fillion et al. | |
| 6,586,955 B2 | 7/2003 | Fjelstad et al. | |
| 6,608,377 B2 | 8/2003 | Chang et al. | |
| 6,638,352 B2 | 10/2003 | Satsu et al. | |
| 6,693,358 B2 | 2/2004 | Yamada et al. | |
| 6,716,737 B2 | 4/2004 | Plas et al. | |
| 6,727,576 B2 | 4/2004 | Hedler et al. | |
| 6,737,300 B2 | 5/2004 | Ding et al. | |
| 6,743,660 B2 | 6/2004 | Lee et al. | |
| 6,812,549 B2 | 11/2004 | Umetsu et al. | |
| 6,828,175 B2 | 12/2004 | Wood et al. | |
| 6,864,172 B2 | 3/2005 | Noma et al. | |
| 6,867,123 B2 | 3/2005 | Katagiri et al. | |
| 6,873,054 B2 | 3/2005 | Miyazawa et al. | |
| 6,879,049 B1 | 4/2005 | Yamamoto et al. | |
| 6,914,336 B2 | 7/2005 | Matsuki et al. | |
| 6,927,156 B2 | 8/2005 | Mathew | |
| 6,982,475 B1 | 1/2006 | MacIntyre | |
| 7,026,175 B2 | 4/2006 | Li et al. | |
| 7,068,139 B2 | 6/2006 | Harris et al. | |
| 7,091,062 B2 | 8/2006 | Geyer | |
| 7,271,033 B2 | 9/2007 | Lin et al. | |
| 7,329,563 B2 | 2/2008 | Lo et al. | |
| 7,413,929 B2 | 8/2008 | Lee et al. | |
| 7,420,257 B2 | 9/2008 | Shibayama | |
| 7,436,069 B2 | 10/2008 | Matsui | |
| 7,446,036 B1 | 11/2008 | Bolom et al. | |
| 7,456,479 B2 | 11/2008 | Lan | |
| 7,531,445 B2 | 5/2009 | Shiv | |
| 7,531,453 B2 | 5/2009 | Kirby et al. | |
| 7,719,121 B2 | 5/2010 | Humpston et al. | |
| 7,750,487 B2 | 7/2010 | Muthukumar et al. | |
| 7,754,531 B2 | 7/2010 | Tay et al. | |
| 7,767,497 B2 | 8/2010 | Haba | |
| 7,781,781 B2 | 8/2010 | Adkisson et al. | |
| 7,791,199 B2 | 9/2010 | Grinman et al. | |
| 7,807,508 B2 | 10/2010 | Oganesian et al. | |
| 7,829,976 B2 | 11/2010 | Kirby et al. | |
| 7,901,989 B2 | 3/2011 | Haba et al. | |
| 7,915,710 B2 | 3/2011 | Lee et al. | |
| 7,935,568 B2 | 5/2011 | Oganesian et al. | |
| 8,008,192 B2 | 8/2011 | Sulfridge | |
| 8,193,615 B2 | 6/2012 | Haba et al. | |
| 8,253,244 B2 | 8/2012 | Kang | |
| 8,263,434 B2 | 9/2012 | Pagaila et al. | |
| 2001/0048591 A1 | 12/2001 | Fjelstad et al. | |
| 2002/0061723 A1 | 5/2002 | Duescher | |
| 2002/0096787 A1 | 7/2002 | Fjelstad | |
| 2002/0109236 A1 | 8/2002 | Kim et al. | |
| 2002/0151171 A1 | 10/2002 | Furusawa | |
| 2003/0059976 A1 | 3/2003 | Nathan et al. | |
| 2003/0071331 A1 | 4/2003 | Yamaguchi et al. | |
| 2003/0178714 A1 | 9/2003 | Sakoda et al. | |
| 2004/0016942 A1 | 1/2004 | Miyazawa et al. | |
| 2004/0017012 A1 | 1/2004 | Yamada et al. | |
| 2004/0043607 A1 | 3/2004 | Farnworth et al. | |
| 2004/0051173 A1 | 3/2004 | Koh et al. | |
| 2004/0061238 A1 | 4/2004 | Sekine | |
| 2004/0104454 A1 | 6/2004 | Takaoka et al. | |
| 2004/0155354 A1 | 8/2004 | Hanaoka et al. | |
| 2004/0173891 A1 | 9/2004 | Imai et al. | |
| 2004/0178495 A1 | 9/2004 | Yean et al. | |
| 2004/0188819 A1 | 9/2004 | Farnworth et al. | |
| 2004/0188822 A1 | 9/2004 | Hara | |
| 2004/0217483 A1 | 11/2004 | Hedler et al. | |
| 2004/0222508 A1 | 11/2004 | Aoyagi | |
| 2004/0251525 A1 | 12/2004 | Zilber et al. | |
| 2004/0259292 A1 | 12/2004 | Beyne et al. | |
| 2005/0012225 A1 | 1/2005 | Choi et al. | |
| 2005/0046002 A1 | 3/2005 | Lee et al. | |
| 2005/0051883 A1 | 3/2005 | Fukazawa | |
| 2005/0056903 A1 | 3/2005 | Yamamoto et al. | |
| 2005/0106845 A1 | 5/2005 | Halahan et al. | |
| 2005/0156330 A1 | 7/2005 | Harris | |
| 2005/0248002 A1 | 11/2005 | Newman et al. | |
| 2005/0260794 A1 | 11/2005 | Lo et al. | |
| 2005/0279916 A1 | 12/2005 | Kang et al. | |
| 2005/0282374 A1 | 12/2005 | Hwang et al. | |
| 2005/0287783 A1 | 12/2005 | Kirby et al. | |
| 2006/0001174 A1 | 1/2006 | Matsui | |
| 2006/0001179 A1 | 1/2006 | Fukase et al. | |
| 2006/0017161 A1 | 1/2006 | Chung et al. | |
| 2006/0043598 A1 | 3/2006 | Kirby et al. | |
| 2006/0046348 A1 | 3/2006 | Kang | |
| 2006/0046463 A1 * | 3/2006 | Watkins et al. | 438/622 |
| 2006/0046471 A1 | 3/2006 | Kirby et al. | |
| 2006/0055050 A1 | 3/2006 | Numata et al. | |
| 2006/0068580 A1 | 3/2006 | Dotta | |
| 2006/0071347 A1 | 4/2006 | Dotta | |
| 2006/0076019 A1 | 4/2006 | Ho | |
| 2006/0079019 A1 | 4/2006 | Kim | |
| 2006/0094231 A1 | 5/2006 | Lane et al. | |
| 2006/0115932 A1 | 6/2006 | Farnworth et al. | |
| 2006/0154446 A1 | 7/2006 | Wood et al. | |
| 2006/0175697 A1 | 8/2006 | Kurosawa et al. | |
| 2006/0197216 A1 | 9/2006 | Yee | |
| 2006/0197217 A1 | 9/2006 | Yee | |
| 2006/0264029 A1 | 11/2006 | Heck et al. | |
| 2006/0278898 A1 | 12/2006 | Shibayama | |
| 2006/0278997 A1 | 12/2006 | Gibson et al. | |
| 2006/0292866 A1 | 12/2006 | Borwick et al. | |
| 2007/0035020 A1 | 2/2007 | Umemoto | |
| 2007/0045779 A1 | 3/2007 | Hiatt | |
| 2007/0052050 A1 | 3/2007 | Dierickx | |
| 2007/0096295 A1 | 5/2007 | Burtzlaff et al. | |
| 2007/0126085 A1 | 6/2007 | Kawano et al. | |
| 2007/0194427 A1 | 8/2007 | Choi et al. | |
| 2007/0231966 A1 | 10/2007 | Egawa | |
| 2007/0249095 A1 | 10/2007 | Song et al. | |
| 2007/0262464 A1 | 11/2007 | Watkins et al. | |
| 2007/0269931 A1 | 11/2007 | Chung et al. | |
| 2007/0290300 A1 | 12/2007 | Kawakami | |
| 2008/0002460 A1 | 1/2008 | Tuckerman et al. | |
| 2008/0020898 A1 | 1/2008 | Pyles et al. | |
| 2008/0032448 A1 | 2/2008 | Simon et al. | |
| 2008/0076195 A1 | 3/2008 | Shiv | |
| 2008/0079779 A1 | 4/2008 | Cornell et al. | |
| 2008/0090333 A1 | 4/2008 | Haba et al. | |
| 2008/0099900 A1 | 5/2008 | Oganesian et al. | |
| 2008/0099907 A1 | 5/2008 | Oganesian et al. | |
| 2008/0111213 A1 | 5/2008 | Akram et al. | |
| 2008/0116544 A1 | 5/2008 | Grinman et al. | |
| 2008/0136038 A1 | 6/2008 | Savastiouk et al. | |
| 2008/0150089 A1 * | 6/2008 | Kwon et al. | 257/621 |
| 2008/0157273 A1 | 7/2008 | Giraudin et al. | |
| 2008/0164574 A1 | 7/2008 | Savastiouk et al. | |
| 2008/0185719 A1 | 8/2008 | Cablao et al. | |
| 2008/0230923 A1 | 9/2008 | Jo et al. | |
| 2008/0246136 A1 * | 10/2008 | Haba et al. | 257/686 |
| 2008/0274589 A1 | 11/2008 | Lee et al. | |
| 2008/0284041 A1 | 11/2008 | Jang et al. | |
| 2009/0008747 A1 * | 1/2009 | Hoshino et al. | 257/621 |
| 2009/0014843 A1 | 1/2009 | Kawashita et al. | |
| 2009/0026566 A1 | 1/2009 | Oliver et al. | |

(56) References Cited

U.S. PATENT DOCUMENTS

| | | | |
|---|---|---|---|
| 2009/0032951 A1 | 2/2009 | Andry et al. |
| 2009/0032966 A1 | 2/2009 | Lee et al. |
| 2009/0039491 A1 | 2/2009 | Kim et al. |
| 2009/0045504 A1 | 2/2009 | Suh |
| 2009/0065907 A1 | 3/2009 | Haba et al. |
| 2009/0085208 A1 | 4/2009 | Uchida |
| 2009/0133254 A1 | 5/2009 | Kubota et al. |
| 2009/0134498 A1 | 5/2009 | Ikeda et al. |
| 2009/0148591 A1 | 6/2009 | Wang et al. |
| 2009/0212381 A1 | 8/2009 | Crisp et al. |
| 2009/0224372 A1 | 9/2009 | Johnson |
| 2009/0243047 A1 | 10/2009 | Wolter et al. |
| 2009/0263214 A1 | 10/2009 | Lee et al. |
| 2009/0267183 A1 | 10/2009 | Temple et al. |
| 2009/0283662 A1 | 11/2009 | Wu et al. |
| 2009/0294983 A1 | 12/2009 | Cobbley et al. |
| 2009/0309235 A1 | 12/2009 | Suthiwongsunthorn et al. |
| 2010/0013060 A1 | 1/2010 | Lamy et al. |
| 2010/0038778 A1 | 2/2010 | Lee et al. |
| 2010/0105169 A1 | 4/2010 | Lee et al. |
| 2010/0117242 A1 | 5/2010 | Miller et al. |
| 2010/0127346 A1 | 5/2010 | DeNatale et al. |
| 2010/0148371 A1 | 6/2010 | Kaskoun et al. |
| 2010/0155940 A1 | 6/2010 | Kawashita et al. |
| 2010/0159699 A1 | 6/2010 | Takahashi |
| 2010/0164062 A1 | 7/2010 | Wang et al. |
| 2010/0167534 A1 | 7/2010 | Iwata |
| 2010/0193964 A1 | 8/2010 | Farooq et al. |
| 2010/0225006 A1 | 9/2010 | Haba et al. |
| 2010/0230795 A1 | 9/2010 | Kriman et al. |
| 2010/0258917 A1 | 10/2010 | Lin |
| 2011/0089573 A1 | 4/2011 | Kurita |
| 2011/0266674 A1 | 11/2011 | Hsia et al. |
| 2012/0018863 A1 | 1/2012 | Oganesian et al. |
| 2012/0018868 A1 | 1/2012 | Oganesian et al. |
| 2012/0018893 A1 | 1/2012 | Oganesian et al. |
| 2012/0018894 A1 | 1/2012 | Oganesian et al. |
| 2012/0018895 A1 | 1/2012 | Oganesian et al. |
| 2012/0068330 A1 | 3/2012 | Oganesian et al. |
| 2012/0068352 A1 | 3/2012 | Oganesian et al. |

FOREIGN PATENT DOCUMENTS

| | | | |
|---|---|---|---|
| CN | 101675516 A | 3/2010 |
| CN | 201910420 U | 7/2011 |
| EP | 0316799 A1 | 5/1989 |
| EP | 0926723 A1 | 6/1999 |
| EP | 1482553 A2 | 12/2004 |
| EP | 1519410 A1 | 3/2005 |
| EP | 1551060 A1 | 7/2005 |
| EP | 1619722 A1 | 1/2006 |
| EP | 1653510 A2 | 5/2006 |
| EP | 1653521 A1 | 5/2006 |
| EP | 1686627 A1 | 8/2006 |
| JP | 60160645 A | 8/1985 |
| JP | 1106949 A | 4/1989 |
| JP | 4365558 A | 12/1992 |
| JP | 11016949 A | 1/1999 |
| JP | 11195706 A | 7/1999 |
| JP | 2001085559 A | 3/2001 |
| JP | 2001-217386 A | 8/2001 |
| JP | 2002162212 A | 6/2002 |
| JP | 2002217331 A | 8/2002 |
| JP | 2002373957 A | 12/2002 |
| JP | 2003318178 A | 11/2003 |
| JP | 2004165602 A | 6/2004 |
| JP | 2004200547 A | 7/2004 |
| JP | 2005026405 A | 1/2005 |
| JP | 2005093486 A | 4/2005 |
| JP | 2005101268 A | 4/2005 |
| JP | 2007053149 A | 3/2007 |
| JP | 2007157844 A | 6/2007 |
| JP | 2007317887 A | 12/2007 |
| JP | 2008-091632 A | 4/2008 |
| JP | 2008-177249 A | 7/2008 |
| JP | 2008227335 | 9/2008 |
| JP | 2008-258258 A | 10/2008 |
| JP | 2010-028601 A | 2/2010 |
| KR | 19990088037 | 12/1999 |
| KR | 20040066018 A | 7/2004 |
| KR | 20060009407 A | 1/2006 |
| KR | 2006-0020822 A | 3/2006 |
| KR | 20070065241 A | 6/2007 |
| KR | 100750741 B1 | 8/2007 |
| KR | 20100087566 A | 8/2010 |
| TW | 200406884 A | 5/2004 |
| TW | 200522274 A | 7/2005 |
| TW | 200535435 A | 11/2005 |
| WO | 03/025998 A2 | 3/2003 |
| WO | 2004114397 | 12/2004 |
| WO | 2008/054660 A2 | 5/2008 |
| WO | 2008108970 A2 | 9/2008 |
| WO | 2009023462 A1 | 2/2009 |
| WO | 2009104668 A1 | 8/2009 |
| WO | 2010104637 A1 | 9/2010 |

OTHER PUBLICATIONS

International Search Report and Written Opinion, PCT/US2011/063025, Mar. 19, 2012.
International Search Report Application No. PCT/US2011/029568, dated Aug. 30, 2011.
International Search Report Application No. PCT/US2011/029568, dated Oct. 21, 2011.
International Written Opinion for Application No. PCT/US2011/063653 dated Jan. 14, 2013.
International Search Report and Written Opinion for PCT/US2011/051552 dated Apr. 11, 2012.
International Search Report and Written Opinion for PCT/US2011/051556 dated Feb. 13, 2012.
International Searching Authority, Search Report for Application No. PCT/US2011/060553 dated Jun. 27, 2012.
Taiwan Office Action for Application No. 100113585 dated Jun. 5, 2012.
International Search Report and Written Opinion for Application No. PCT/US2011/029394 dated Jun. 6, 2012.
Partial International Search Report for Application No. PCT/US2011/063653 dated Jul. 9, 2012.
Japanese Office Action for Application No. 2009-552696 dated Aug. 14, 2012.
Japanese Office Action for Application No. 2010-519953 dated Oct. 19, 2012.
International Search Report and Written Opinion for Application No. PCT/US2011/060553 dated Oct. 26, 2012.
Partial International Search Report, PCT/US2008/002659.
International Search Report, PCT/US2008/002659.
U.S. Appl. No. 12/143,743, "Reconstituted Wafer Level Stacking", filed Jun. 20, 2008.
U.S. Appl. No. 11/590,616, filed Oct. 31, 2006.
U.S. Appl. No. 11/789,694, filed Apr. 25, 2007.
PCT/US08/09207, "Reconstituted Wafer Stack Packaging With After Applied Pad Extensions," filed Jul. 25, 2008.
International Search Report, PCT/US2008/009356.
U.S. Appl. No. 12/784,841.
U.S. Appl. No. 12/842,612.
U.S. Appl. No. 12/842,651.
U.S. Appl. No. 12/723,039.
International Search Report and Written Opinion, PCT/US2010/002318, dated Nov. 22, 2010.
International Search Report and Written Opinion, PCT/US2010/052458, dated Jan. 31, 2011.
Supplementary European Search Report, EP 08795005 dated Jul. 5, 2010.
International Search Report, PCT/US10/52783, Dated Dec. 10, 2010.
International Search Report and Written Opinion, PCT/US2010/052785, Dated Dec. 20, 2010.
Chinese Office Action for Application No. 201010546793.9 dated Jun. 25, 2013.
Taiwanese Office Action for Application No. 099143374 dated Jun. 24, 2013.

* cited by examiner

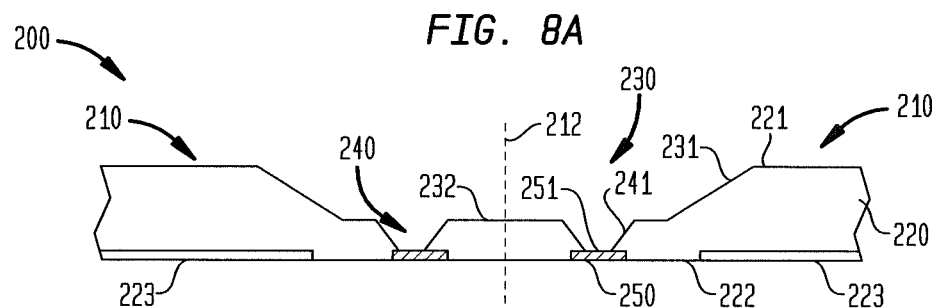
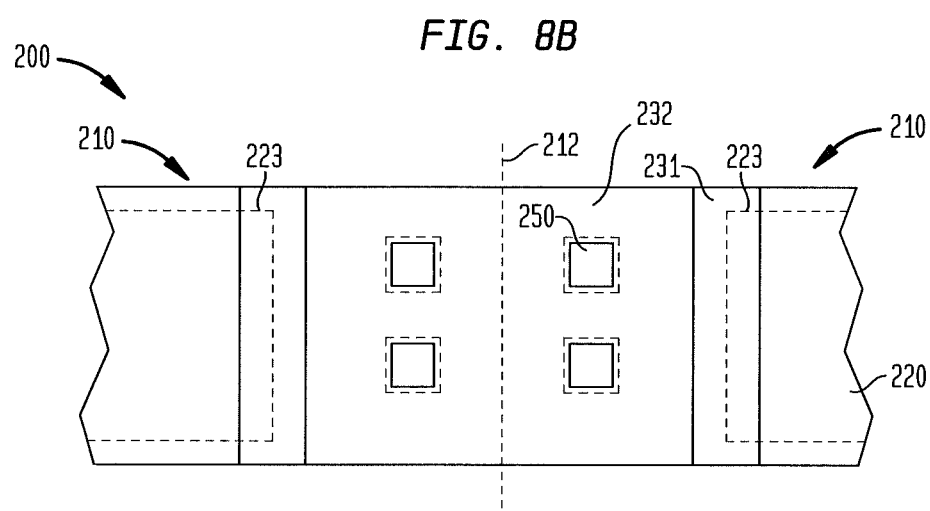
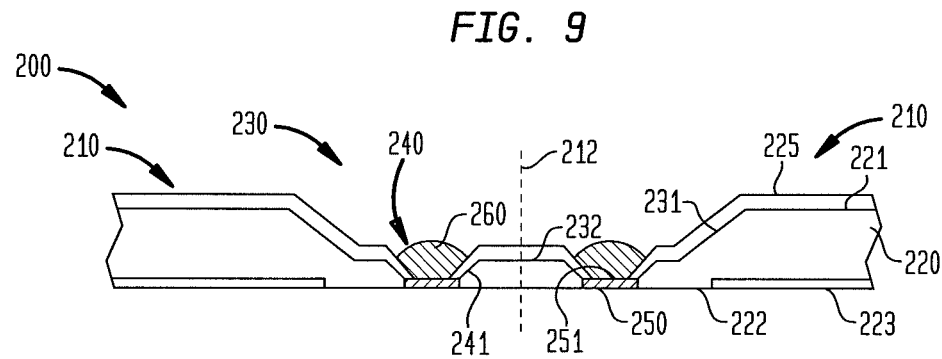

MICROELECTRONIC ELEMENTS HAVING METALLIC PADS OVERLYING VIAS

BACKGROUND OF THE INVENTION

The present invention relates to packaging of microelectronic devices, especially the packaging of semiconductor devices.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

Through-silicon vias (TSVs) are used to connect the bond pads with a second face of the semiconductor chip opposite the first face (e.g., a rear surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Conventional vias may have reliability challenges because of a non-optimal stress distribution inside of the vias and a mismatch of the coefficient of thermal expansion (CTE) between a semiconductor chip, for example, and the structure to which the chip is bonded. For example, when conductive vias within a semiconductor chip are insulated by a relatively thin and stiff dielectric material, significant stresses may be present within the vias. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, there is still a need for improvements in order to minimize the size of semiconductor chips, while enhancing electrical interconnection reliability. These attributes of the present invention are achieved by the construction of the microelectronic packages as described hereinafter.

SUMMARY OF THE INVENTION

In accordance with an aspect of the invention, a microelectronic unit includes a semiconductor element having a front surface and a rear surface remote from the front surface. The semiconductor element can have a plurality of active semiconductor devices therein. The semiconductor element can have a plurality of conductive pads, each pad having a top surface exposed at the front surface and having a bottom surface remote from the top surface. The semiconductor element can have a first opening extending from the rear surface partially through the semiconductor element towards the front surface. The semiconductor element can have at least one second opening, each second opening extending from the first opening to at least the bottom surface of a respective one of the pads.

The microelectronic unit can also include at least one conductive via extending within a respective one of the at least one second opening and being electrically connected with the respective pad. The microelectronic unit can also include a dielectric region overlying a surface of the semiconductor element in the first opening. The dielectric region can have an aperture extending away from the conductive via, wherein a contour of the aperture does not conform to a contour of the first opening. In one embodiment, the aperture can have at least one of cylindrical or frusto-conical shape.

The microelectronic unit can also include at least one conductive interconnect electrically connected to a respective conductive via and extending away therefrom within the aperture. The microelectronic unit can also include at least one conductive contact exposed for interconnection with an external element. The contact can be electrically connected to a respective conductive interconnect, the at least one contact being aligned in a vertical direction with a portion of the semiconductor element within the first opening, the vertical direction being a direction of a thickness of the semiconductor element between the front and rear surfaces.

In an exemplary embodiment, a single active semiconductor region can contain the plurality of active semiconductor devices. In one embodiment, each of a plurality of active semiconductor regions can contain a portion of the plurality of active semiconductor devices. In a particular embodiment, the dielectric region can be compliant. In one embodiment, the first opening can have a first width in a lateral direction along the rear surface, and at least one of the conductive contacts can have a second width in the lateral direction, the first width being greater than the second width. In an exemplary embodiment, a plurality of the conductive interconnects can extend within a particular first opening and a plurality of the vias can extend within respective second openings which meet the particular first opening and electrically connect ones of the conductive interconnects to respective conductive pads exposed at the semiconductor element front surface.

In one embodiment, the first opening can have a width in a first lateral direction along the rear surface, and the first opening can have a length in a second lateral direction along the rear surface transverse to the first lateral direction, the length being greater than the width. In an exemplary embodiment, the first opening can define a channel shape. In a particular embodiment, the first opening can be a plurality of first openings, each of at least some of the first openings having a single aperture and a single conductive interconnect extending therein. In an exemplary embodiment, the conductive contact can include a thin flat member. In a particular embodiment, the microelectronic unit can include a conductive bond material exposed at a surface of the conductive contact.

In an exemplary embodiment, the microelectronic unit can include a substrate having a substrate contact thereon, the substrate contact being conductively joined with the conductive contact. In one embodiment, the microelectronic unit can include a polymeric layer overlying the dielectric region and separating respective areas of the bond material. In a particular embodiment, the at least one conductive contact can have a surface exposed above a plane defined by the rear surface. In an exemplary embodiment, the surface of the dielectric region can extend above a plane defined by the rear surface.

In a particular embodiment, the second opening can have a width at the bottom surface of the conductive pad which exceeds a width of the second opening where the first and second openings meet. In an exemplary embodiment, a second aperture extending within a dielectric layer within the second opening may not conform to a contour of the second opening and the via may not conform to the contour of the second opening. In a particular embodiment, at least one conductive contact can be moveable relative to the front surface of the semiconductor element when an external load is applied to the conductive contact.

In one embodiment, the conductive interconnect can include a conductive layer overlying an inner surface within the aperture and a dielectric layer overlying the conductive layer within the aperture. In an exemplary embodiment, the aperture can be a first aperture, and the second opening can include a second dielectric region overlying an inner surface thereof, the second dielectric region having a second aperture, and the at least one via can extend within the second aperture. In one embodiment, a width of the first aperture can define a step change relative to a width of the second aperture where the first and second apertures meet. In one embodiment, the second aperture can have at least one of cylindrical or frusto-conical shape.

In an exemplary embodiment, each conductive pad can at least partially overlie a respective one of the conductive vias. In a particular embodiment, each conductive via can contact the bottom surface of a respective one of the conductive pads. In one embodiment, the second opening can have an upper surface opposite the bottom surface of the conductive pad and an inner surface extending between the upper surface of the second opening and the bottom surface of the conductive pad, and the second opening can have an upper diameter where the upper surface and the inner surface meet that exceeds a width of the first opening where the first and second openings meet. In an exemplary embodiment, the microelectronic unit can include a lid member attached to the front surface of the semiconductor element. In one embodiment, a microelectronic assembly can include at least first and second microelectronic units, the first microelectronic unit being stacked with the second microelectronic unit, with the semiconductor elements therein being electrically connected to each other.

In accordance with an aspect of the invention, an interconnection substrate includes a semiconductor element having a front surface and a rear surface remote from the front surface. The interconnection substrate can also include a plurality of conductive structures. Each conductive structure can have a top surface exposed at the front surface and a bottom surface remote from the top surface. The semiconductor element can have a first opening extending from the rear surface partially through the semiconductor element towards the front surface. The semiconductor element can also have at least one second opening. Each second opening can extend from the first opening to at least the bottom surface of a respective one of the pads.

The interconnection substrate can also include a dielectric region overlying a surface of the semiconductor element in the first opening. The dielectric region can have an aperture extending downward from an outer surface of the dielectric region, wherein a contour of the aperture does not conform to a contour of the first opening. In one embodiment, the aperture can have at least one of cylindrical or frusto-conical shape.

The interconnection substrate can also include at least one conductive interconnect electrically connected to a respective conductive structure and extending away therefrom within the aperture. The interconnection substrate can also include at least one conductive contact exposed for interconnection with an external element. The contact can be electrically connected to a respective conductive interconnect. The at least one contact can be aligned in a vertical direction with a portion of the semiconductor element within the first opening, the vertical direction being a direction of a thickness of the semiconductor element between the front and rear surfaces.

In an exemplary embodiment, the interconnection substrate can also include at least one conductive via extending within a respective one of the at least one second opening and being electrically connected with a respective conductive interconnect. In one embodiment, each of the plurality of conductive structures can be a conductive pad that is electrically connected with a respective conductive via. In a particular embodiment, the first opening can have a first width in a lateral direction along the rear surface, and at least one of the conductive contacts can have a second width in the lateral direction, the first width being greater than the second width. In one embodiment, the second opening can have a first width in a lateral direction along the front surface, and at least one of the conductive structures can have a second width in the lateral direction, the first width being greater than the second width.

In accordance with an aspect of the invention, a microelectronic unit includes a semiconductor element having a front surface and a rear surface remote from the front surface. The semiconductor element can have a plurality of active semiconductor devices therein. The microelectronic unit can also include a plurality of conductive pads, each pad having a top surface exposed at the front surface and having a bottom surface remote from the top surface. The semiconductor element can have having a first opening extending from the rear surface partially through the semiconductor element towards the front surface. The semiconductor element can have and at least one second opening. Each second opening can extend from the first opening to at least the bottom surface of a respective one of the pads.

The microelectronic unit can also include at least one conductive interconnect extending within the first opening and a respective one of the at least one second opening. The conductive interconnect can be electrically connected with the respective pad. Each conductive interconnect can have a conductive via portion extending within the respective one of the at least one second opening and a conductive interconnect portion extending within the first opening.

The microelectronic unit can also include a dielectric region overlying a first surface of the semiconductor element in the first opening and a second surface of the semiconductor element in the second opening. The dielectric region can have an aperture extending therethrough. A contour of the aperture may not conform to a contour of the first opening nor a contour of the second opening. In one embodiment, the aperture can have at least one of cylindrical or frusto-conical shape.

The microelectronic unit can also include at least one conductive contact exposed for interconnection with an external element. The contact can be electrically connected to a respective conductive interconnect. The at least one contact can be aligned in a vertical direction with a portion of the semiconductor element within the first opening, the vertical direction being a direction of a thickness of the semiconductor element between the front and rear surfaces.

In one embodiment, a single active semiconductor region can contain the plurality of active semiconductor devices. In an exemplary embodiment, each of a plurality of active semiconductor regions can contain a portion of the plurality of active semiconductor devices. In a particular embodiment, the first opening can have a first width in a lateral direction along the rear surface, and at least one of the conductive contacts can have a second width in the lateral direction, the first width being greater than the second width. In an exemplary embodiment, the second opening can have a first width in a lateral direction along the front surface, and at least one of the conductive pads can have a second width in the lateral direction, the first width being greater than the second width. In one embodiment, the conductive interconnect can be hollow and filled with a conductive mass. In one embodiment, a microelectronic assembly can include at least first and second microelectronic units, the first microelectronic unit being stacked with the second microelectronic unit, with the semiconductor elements therein being electrically connected to each other.

In accordance with an aspect of the invention, a microelectronic unit includes a semiconductor element having a front surface and a rear surface remote from the front surface. The microelectronic unit can also include a plurality of conductive pads. Each pad can have a top surface exposed at the front surface and a bottom surface remote from the top surface. The semiconductor element can have a first opening extending from the rear surface partially through the semiconductor element towards the front surface. The semiconductor element can have a second opening. Each second opening can extend from the first opening to at least the bottom surface of a respective one of the pads.

The microelectronic unit can also include at least one conductive via extending within a respective one of the at least one second opening and being electrically connected with the respective pad. The microelectronic unit can also include a dielectric region overlying a surface of the semiconductor element in the first opening. The dielectric region can have an aperture extending away from the conductive via. A contour of the aperture may not conform to a contour of the first opening. The microelectronic unit can also include at least one conductive interconnect. The conductive interconnect can be electrically connected to a respective conductive via and can extend away therefrom within the aperture. The conductive interconnect can be exposed at an outer surface of the dielectric region for interconnection with an external element. In one embodiment, the aperture can have at least one of cylindrical or frusto-conical shape.

In an exemplary embodiment, the conductive interconnect can define a top surface that extends above the outer surface of the dielectric region. In a particular embodiment, the conductive interconnect can define a top surface that is recessed below the outer surface of the dielectric region. In one embodiment, the conductive interconnect can define a top surface that is level with or approximately level with the outer surface of the dielectric region. In an exemplary embodiment, the semiconductor element can have a plurality of active semiconductor devices therein.

In accordance with an aspect of the invention, a method of fabricating a microelectronic unit includes the step of providing a semiconductor element having a front surface and a rear surface remote from the front surface. The semiconductor element can have a plurality of active semiconductor devices therein. The semiconductor element can include a plurality of conductive pads. Each pad can have a top surface exposed at the front surface and a bottom surface remote from the top surface.

The method of fabricating a microelectronic unit can also include the step of forming a first opening extending from the rear surface partially through the semiconductor element towards the front surface. The method can also include the step of removing semiconductor material through a hole in a first dielectric layer within the first opening to form at least one second opening extending from the first opening to at least the bottom surface of a respective one of the pads. The method can also include the step of forming a conductive via within the second opening.

The method of fabricating a microelectronic unit can also include the step of forming a dielectric region having an aperture extending through the dielectric region. The aperture can have a constant diameter or can taper in a direction towards the front surface. The aperture can have a contour not conforming to a contour of the second opening. The method can also include the step of forming a conductive contact exposed for interconnection to an external element and being aligned in a vertical direction with a portion of the semiconductor element within the first opening, the vertical direction being a direction of a thickness of the semiconductor element between the front and rear surfaces. The contact can be electrically connected to the conductive via by a conductive interconnect extending within the aperture. In one embodiment, the aperture can have at least one of cylindrical or frusto-conical shape.

In a particular embodiment, the method of fabricating a microelectronic unit can include the step of forming a second dielectric layer conformally coating an inner surface of the second opening including electrochemically depositing a polymer within the second opening. In one embodiment, the step of forming the first opening can include using laser ablation. In an exemplary embodiment, the step of forming the conductive via can include filling the second opening with a dielectric material. In a particular embodiment, the step of forming the conductive via can include forming a second aperture having a cylindrical or frusto-conical shape within the second opening. In one embodiment, the step of forming the conductive via can include depositing a conductive material within the second aperture.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIGS. 8A and 8B are a sectional view and a corresponding top-down plan view illustrating a stage of fabrication in accordance with an embodiment of the invention.

FIG. 9 is a sectional view illustrating a stage in a method of fabrication in accordance with an embodiment of the invention.

DETAILED DESCRIPTION

Figure 1A:
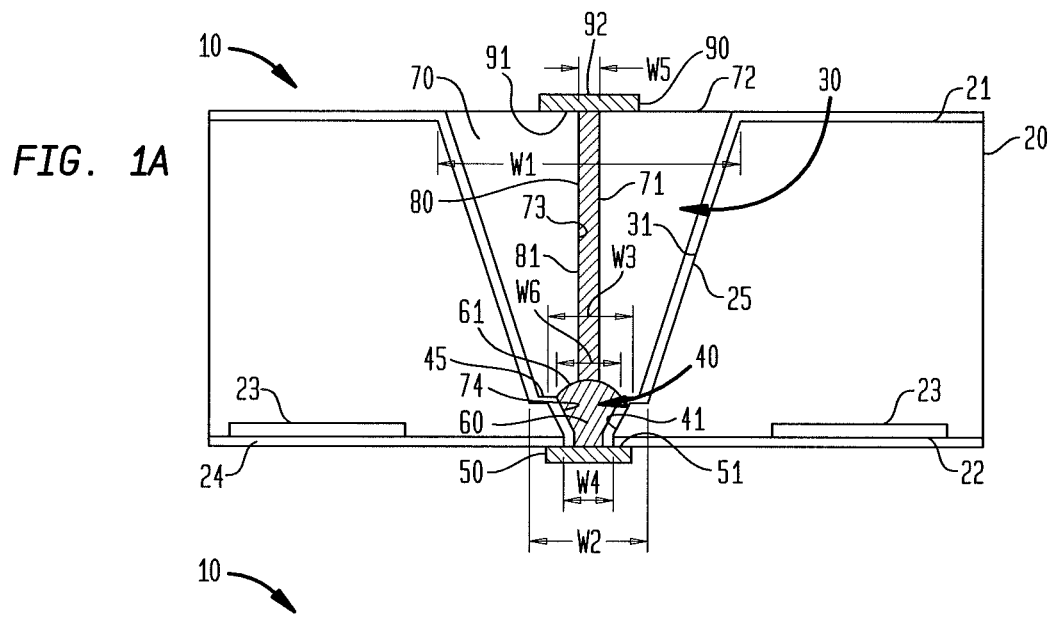
FIGS. 1A and 1B are a sectional view and a corresponding top-down plan view illustrating a via structure in accordance with an embodiment of the invention.
Figure 1B:
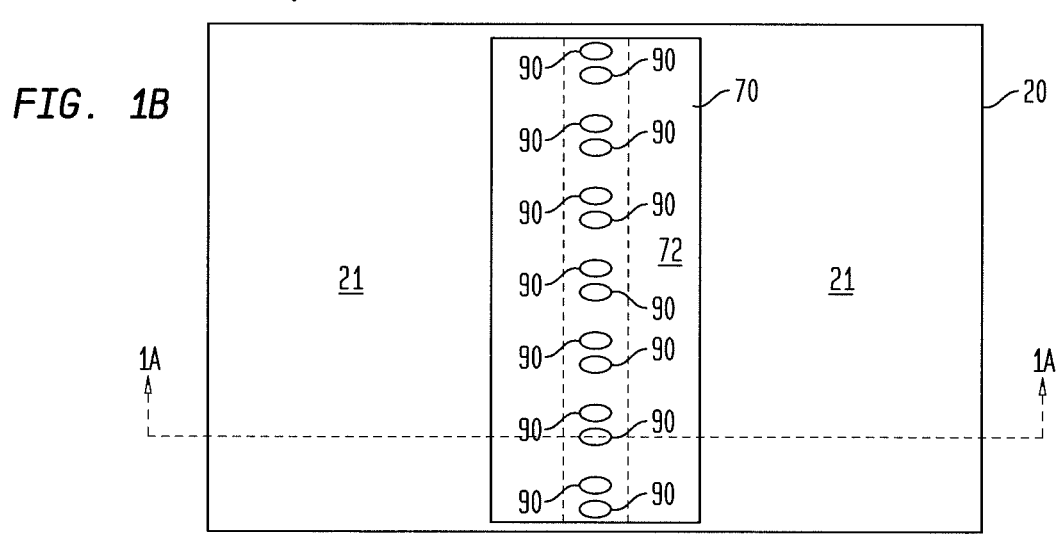

FIGS. 1A and 1B are a sectional view and a corresponding top-down plan view illustrating a via structure in accordance with an embodiment of the invention. As illustrated in FIGS. 1A and 1B, a microelectronic unit 10 includes a semiconductor element 20 having a first opening 30 extending from a rear surface 21 partially through the semiconductor element 20 towards a front surface 22 and a second opening 40 extending from the first opening 30 to a bottom surface of a conductive pad 50, a conductive via 60 extending within the second opening 40, a dielectric region 70 overlying an inner surface 31 in the first opening 30, a conductive interconnect 80 extending within the first opening 30, and a conductive contact 90 electrically connected to the conductive interconnect 80. The conductive contact 90 can overlie an inner surface 31 of the first opening and may wholly overlie the inner surface 31 or a lower surface 45 or both.

The semiconductor element 20 can include a semiconductor substrate, which can be made from silicon, for example. A plurality of active semiconductor devices (e.g., transistors, diodes, etc.) can be disposed in an active semiconductor region 23 thereof located at and/or below the front surface 22. The thickness of the semiconductor element between the front surface 22 and the rear surface 21 typically is less than 200 µm, and can be significantly smaller, for example, 130 µm, 70 µm or even smaller.

The semiconductor element 20 can further include a dielectric layer 24 located between the front surface 22 and the conductive pad 50. The dielectric layer 24 electrically insulates the conductive pad 50 from the semiconductor element 20. This dielectric layer 24 can be referred to as a "passivation layer" of the microelectronic unit 10. The dielectric layer 24 can include an inorganic or organic dielectric material or both. The dielectric layer 24 may include an electrodeposited conformal coating or other dielectric material, for example, a photoimageable polymeric material, for example, a solder mask material.

The first opening 30 extends from the rear surface 21 partially through the semiconductor element 20 towards the front surface 22. The first opening 30 includes inner surface that extend from the rear surface 21 through the semiconductor element 20 at an angle between 0 and 90 degrees to the horizontal plane defined by the rear surface 21. The inner surface 31 can have a constant slope or a varying slope. For example, the angle or slope of the inner surface 31 relative to the horizontal plane defined by the rear surface can decrease in magnitude (i.e., become less positive or less negative) as the inner surface 31 penetrates further towards the front surface 22.

As shown in FIG. 1A, the first opening 30 has a width W1 at the rear surface 21 and a width W2 at the lower surface 45 that is less than W1 such that the first opening is tapered in a direction from the rear surface towards the lower surface. In other examples, the first opening can have a constant width, or the first opening can be tapered in a direction from the lower surface towards the rear surface.

The first opening 30 may extend more than half-way from the rear surface 21 towards the front surface 22, such that a height of the first opening 30 in a direction perpendicular to the rear surface 21 is greater than a height of the second opening 40.

The first opening 30 can have any top-view shape, including for example, a rectangular channel with a plurality of second openings 40, as shown in FIG. 1B. In one embodiment, such as in the interposer embodiment shown in FIG. 21, the first opening 30 can have a round top-view shape (in FIG. 21, the first opening 30 has a frusto-conical three-dimensional shape). In the embodiment shown in FIG. 1B, first opening 30 has a width in a first lateral direction along the rear surface 21, and the first opening 30 has a length in a second lateral direction along the rear surface 21 transverse to the first lateral direction, the length being greater than the width. In some examples, the first opening 30 can have any three-dimensional shape, including for example, a cylinder, a cube, or a prism, among others.

The second opening 40 can extend from the first opening 30 to the bottom surface 51 of the conductive pad 50. As shown in FIG. 1A, the second opening 40 has a width W3 at the lower surface 45 of the first opening 30 and a width W4 at the bottom surface 51 of the conductive pad 50 such that the second opening is tapered in a direction from the first opening towards the bottom surface of the conductive pad. In other examples, the second opening can have a constant width, or the second opening can be tapered in a direction from the front surface towards the first opening (e.g., such as in the interposer embodiments shown in FIGS. 17-19).

The inner surface 41 can have a constant slope or a varying slope. For example, the angle or slope of the inner surface 41 relative to the horizontal plane defined by the rear surface 21 can decrease in magnitude (i.e., become less positive or less negative) as the inner surface 41 penetrates further from the bottom surface 51 of the conductive pad 50 towards the rear surface 21.

The second opening 40 can extend less than half-way from the bottom surface 51 of the conductive pad 50 towards the front surface 22, such that a height of the second opening 40 in a direction perpendicular to the rear surface 21 is less than a height of the first opening 30.

The second opening 40 can have any top-view shape, including for example, a round shape, as shown in FIG. 1B (in FIG. 1B, the second opening 40 has a frusto-conical three-dimensional shape). In some embodiments, such as in the embodiment shown in FIGS. 8A through 11B, the second opening 40 can have a square, rectangular, oval, or any other top-view shape. In some examples, the second opening 40 can have any three-dimensional shape, including for example, a cylinder, a cube, or a prism, among others.

Any number of second openings 40 can extend from a single first opening 30, and the second openings 40 can be arranged in any geometric configuration within a single first opening 30. For example, fourteen second openings 40 can arranged along a common axis, as shown in FIG. 1B, or seven second openings 40 can be arranged along a common axis, as shown in FIG. 12B. In one embodiment, such as in the embodiment shown in FIGS. 8A through 11B, there can be four second openings 40 arranged in two parallel rows. In another embodiment, such as in the embodiment shown in FIGS. 22A and 22B, there can be four second openings 40 arranged in a cluster. In yet another embodiment, such as in the embodiment shown in FIG. 20B, there can be two parallel rows of second openings 40 extending from a single channel-shaped first opening 30. Particular examples of various first and second opening configurations and methods of forming these configurations are described in the herein incorporated commonly owned U.S. Patent Application Publication No. 2008/0246136.

As seen in FIGS. 1A and 1B, the semiconductor element 20 includes one or more conductive pads 50 exposed at the front surface 22 of the semiconductor element 20. While not specifically shown in FIGS. 1A and 1B, the active semiconductor devices in the active semiconductor region 23 typically are conductively connected to the conductive pads 50. The active semiconductor devices, thus, are accessible conductively through wiring incorporated extending within or above one or more dielectric layers of the semiconductor element 20. In some embodiments, such as that shown in FIG. 13A, the contact pads may not be directly exposed at the front surface of the semiconductor element. Instead, the contact pads may be electrically connected to traces extending to terminals that are exposed at the front surface of the semiconductor element. The conductive pads 50 can be made from any electrically conductive metal, including for example, copper or gold. As shown, the conductive pads 50 have a round top-view shape. In other examples, the conductive pads 50 and any of the conductive pads disclosed herein can have any top-view shape, including an oval, triangle, square, rectangle, or any other shape.

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

While essentially any technique usable for forming conductive elements can be used to form the conductive elements described herein, non-lithographic techniques as discussed in greater detail in the co-pending, commonly assigned U.S. patent application Ser. No. 12/842,669, filed Jul. 23, 2010, can be employed. Such non-lithographic techniques can include, for example, selectively treating a surface with a laser or with mechanical processes such as milling or sand-blasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

The conductive via 60 extends within the second opening 40 and is electrically connected with the conductive pad 50 and the conductive interconnect 80. The conductive via contacts the bottom surface 51 of the conductive pad 50. The conductive pad 50 at least partially overlies the conductive via 60.

As shown in FIG. 1A, the conductive via 60 can fill all of the volume within the second opening 40 inside of a dielectric layer 25 that electrically insulates the semiconductor element 20 from the conductive via 60. In other words, a second aperture 74 extending within the dielectric layer 25 within the second opening 40 conforms to a contour of the second opening 40, and the conductive via 60 conforms to the contour of the second opening 40.

Figure 2:
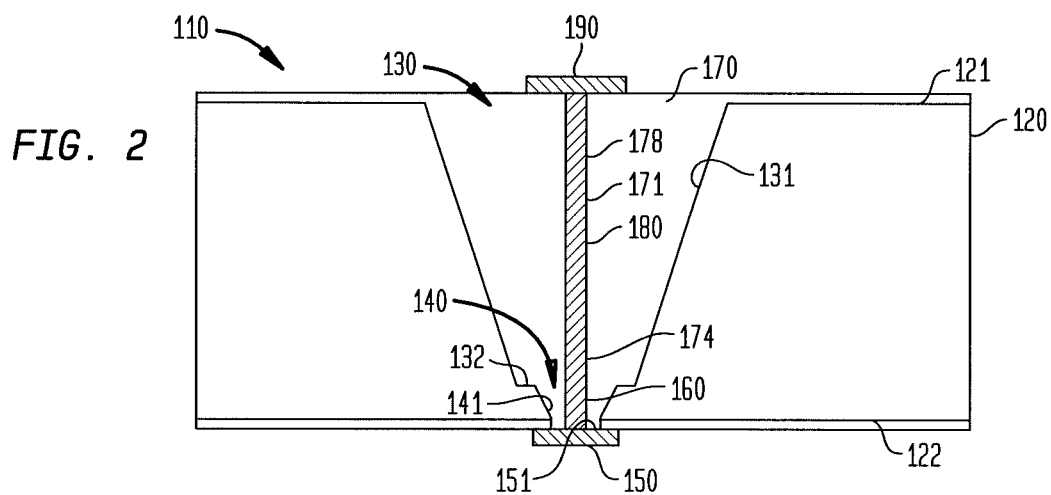
FIG. 2 is a sectional view illustrating a via structure in accordance with another embodiment.

In other embodiments, such as that shown in FIG. 2, the conductive via portion of a conductive interconnect that is located inside within the second opening may have a cylindrical or frusto-conical shape. The conductive via 60 can be made from a metal or an electrically conductive compound of a metal, including for example, copper or gold.

The dielectric region 70 can provide good dielectric isolation with respect to the semiconductor element 20. The dielectric region 70 can be compliant, having a sufficiently low modulus of elasticity and sufficient thickness such that the product of the modulus and the thickness provide compliancy. Specifically, such a compliant dielectric region 70 can allow the conductive interconnect 80 and the conductive contact 90 attached thereto to flex or move somewhat relative to the semiconductor element 20 when an external load is applied to the conductive contact 90. In that way, the bond between the conductive contacts 90 of the microelectronic unit 10 and terminals of a circuit panel (not shown) can better withstand thermal strain due to mismatch of the coefficient of thermal expansion ("CTE") between the microelectronic unit 10 and the circuit panel.

In one embodiment (e.g., the embodiment shown and described with respect to FIG. 18), the degree of compliancy provided by the product of the thickness of the dielectric region and its modulus of elasticity can be sufficient to compensate for strain applied to the conductive contacts due to thermal expansion mismatch between the microelectronic unit and a substrate to which the microelectronic unit is mounted through the conductive contacts. An underfill (not shown) can be provided between the exposed surface of the dielectric region and such circuit panel to enhance resistance to thermal strain due to CTE mismatch.

In the embodiments shown, an outer surface 72 of the dielectric region 70 is located within a plane defined by the rear surface 21 of the semiconductor element 20. In other embodiments (not shown), the outer surface 72 of the dielectric region 70 can extend above a plane defined by the rear surface 21 of the semiconductor element 20.

A first aperture 71 is provided in the dielectric region 70. The first aperture 71 has a cylindrical shape and extends through the dielectric region 70 from a bottom surface 91 of the conductive contact 90 to the conductive via 60. In other embodiments (not shown), the first aperture 71 can have other shapes, including for example, a frusto-conical shape or a combination of a cylindrical and a frusto-conical shape at different distances from the rear surface 21. In the embodiments shown, a contour of the first aperture 71 (i.e., the shape of the outer surface of the first aperture 71) does not conform to a contour of the first opening 30 (i.e., the shape of the inner surface 31 of the first opening 30).

The conductive interconnect 80 extends within the first opening 30 inside the first aperture 71 and is electrically connected with the conductive via 60 and the conductive contact 90. As shown in FIG. 1A, the conductive interconnect 80 has a cylindrical shape. In other embodiments (not shown), the conductive interconnect 80 can have other shapes, including for example, a frusto-conical shape or a combination of a cylindrical and a frusto-conical shape at different distances from the rear surface 21. In the embodiments shown, a contour of the conductive interconnect 80 (i.e., the shape of the outer surface of the conductive interconnect 80) does not conform to a contour of the first opening 30 (i.e., the shape of the inner surface 31 of the first opening 30). The conductive interconnect 80 can be made from any electrically conductive metal, including for example, copper or gold.

As shown in FIG. 1A, the conductive interconnect 80 is solid. In other embodiments (not shown), the conductive interconnect can include an internal space that is filled with a dielectric material. For example, the conductive interconnect 80 can be formed by plating an inner surface 73 of the first aperture 71 that extends through the dielectric region 70, thereby producing a conductive layer overlying the inner surface 73 of the first aperture 71. The conductive interconnect 80 can be formed either solid or hollow depending upon the process conditions. Under appropriate process conditions, a conductive interconnect that includes an internal space can be produced, and that internal space can then be filled with a dielectric material, whereby a dielectric layer overlies the conductive layer within the first aperture 71.

As shown in FIG. 1A, the conductive interconnect 80 and the conductive via 60 can have different shapes, wherein the outer surface 81 of the conductive interconnect 80 has a slope discontinuity at the transition point to an upper surface 61 of the conductive via 60. In other words, a width W5 of the first aperture 71 within the first opening 30 defines a step change relative to a width W6 of a second aperture 74 within the second opening 40 where the first and second apertures meet.

The conductive contact 90 is exposed at the outer surface 72 of the dielectric region 70 for interconnection to an external element. The conductive contact 90 is electrically connected to the conductive interconnect 80 at the bottom surface 91 thereof.

The conductive contact 90 can be aligned with the first opening 30 and can be disposed wholly or partly within an area of the semiconductor element 20 defined by the first opening 30. As seen in FIG. 1A, the conductive contact 90 is wholly disposed within an area defined by the first opening 30. A plane defined by a top surface 92 of the conductive contact 90 is substantially parallel to the plane defined by the rear surface 21 of the semiconductor element 20.

As shown, the bottom surface 91 of the conductive contact 90 is located above the plane defined by the rear surface 21 of the semiconductor element 20. In other embodiments, the bottom surface 91 of the conductive contact 90 can be located at or below the plane defined by the rear surface 21.

As shown, the conductive contact 90 has the shape of a conductive bond pad, e.g., a thin flat member. In other embodiments, the conductive contact can be any other type of conductive contact, including for example, a conductive post.

As shown, the first opening 30 has a first width in a lateral direction along the rear surface 21, and at least one of the conductive contacts 90 has a second width in the lateral direction, the first width being greater than the second width.

In some embodiments (e.g., the stacked embodiment shown in FIG. 16), conductive bond material can be exposed at a surface of the conductive contact 90 for interconnection to an external element.

Reference is now made to FIG. 2, which illustrates a sectional view of a via structure in accordance with another embodiment. The microelectronic unit 110 is similar to the microelectronic unit 10 described above, but the microelectronic unit 110 differs in the structure of the dielectric region and in the configuration of the electrical connection between the conductive pad and the conductive contact.

Rather than having a separate conductive interconnect and conductive via, the microelectronic unit 110 includes a single unitary conductive interconnect 178 extending between the conductive pad 150 and the conductive contact 190. The conductive interconnect 178 includes a conductive interconnect portion 180 extending from the conductive contact 190 through the first opening 130 and a conductive via portion 160 extending from the conductive pad 150 through the second opening 140.

In one embodiment, the microelectronic unit 110 can include a single unitary dielectric region 170 coating the inner surface 131 of the first opening 130, the inner surface 141 of the second opening 140, and the rear surface 121 of the semiconductor element 120. The dielectric region 170 can also fill a space between the inner surfaces 131 and 141 and the conductive interconnect 178. Alternatively, the dielectric region 170 can include two or more layers of material.

To form the single conductive interconnect 178, the dielectric region 170 is applied inside of the first opening 130 and the second opening 140, an aperture 171 is created extending through the dielectric region 170 to a bottom surface 151 of the conductive pad 150, for example via laser ablation or mechanical drilling, and the aperture 171 is plated with a conductive metal such as copper or gold. Similar to the conductive interconnect 80 shown in FIG. 1A, the conductive interconnect 178 may be solid or may contain an internal space that is filled with a dielectric material.

In the embodiment shown in FIG. 2, a portion 174 of the aperture 171 extending within the dielectric region 170 within the second opening 140 does not conform to a contour of the second opening 140 and the conductive via 160 does not conform to the contour of the second opening 140.

Figure 3A:
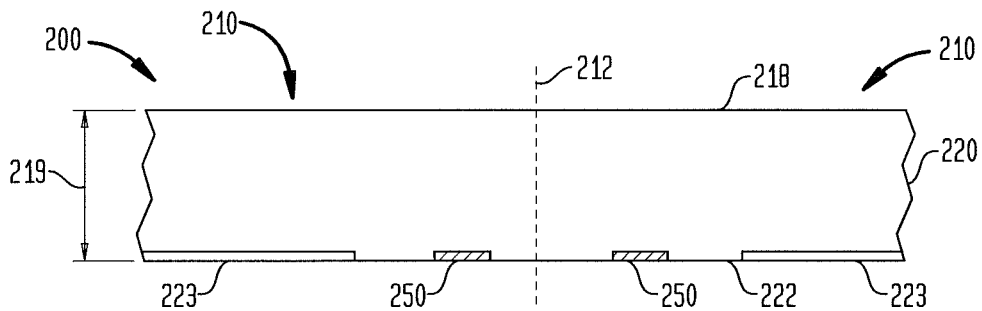
FIGS. 3A and 3B are a sectional view and a corresponding top-down plan view illustrating a stage of fabrication in accordance with an embodiment of the invention.

Referring to FIG. 3A, microelectronic units 210 can be processed simultaneously by wafer-level processing, i.e., by processing performed simultaneously to a plurality of microelectronic units 210 while they remain joined together as a portion of a wafer or as an entire semiconductor device wafer. After reaching a stage of fabrication illustrated in FIG. 11A for example, the wafer can be severed along dicing lane 212 and other dicing lanes not visible within the view of FIG. 3A into individual packaged microelectronic units 210.

A method of simultaneously fabricating a plurality of microelectronic units 210 (FIG. 11A) will now be described, with reference to FIGS. 3A through 11B. As illustrated in FIG. 3A, a semiconductor device wafer 200 or portion of a device wafer 200 contains a plurality of microelectronic units 210. Each microelectronic unit 210 includes a semiconductor element 220 having one or more active semiconductor regions 223 and conductive pads 250.

Dicing lane 212 indicates a location of a dicing lane at a boundary between individual microelectronic units 210. Dicing lanes 212 of the device wafer 200 need not be very wide. The locations of conductive pads 250 of the microelectronic units 210 can be spaced apart from the dicing lanes. A representative width of the dicing lane 212 is approximately 40 μm (microns).

Figure 3B:
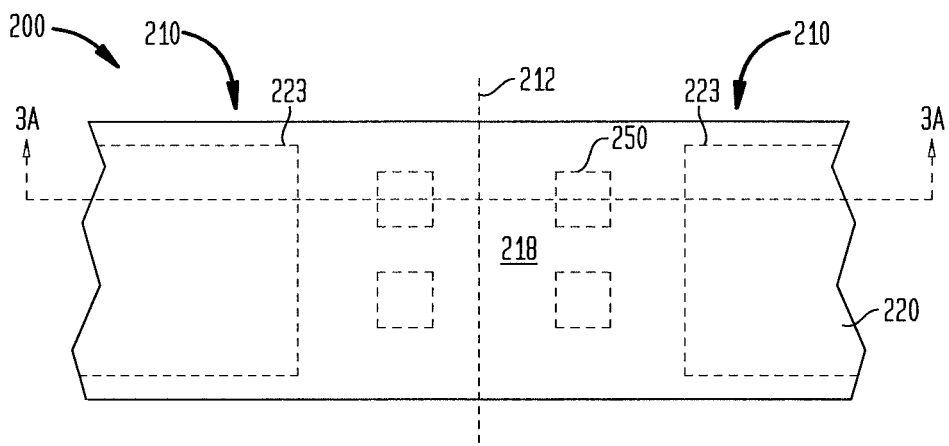

As illustrated in plan view in FIG. 3B, an initial rear surface 218 of the microelectronic units 210 overlies the front surface 222 of the microelectronic units 210. Desirably, at this stage of fabrication, the initial rear surface 218 is spaced uniformly from the front surface 222 of the microelectronic unit 210 by an initial thickness 219 of the device wafer 200. Locations of the conductive pads 250 underlying the device wafer 200 and dicing lane 212 are indicated in a FIG. 3B looking toward the initial rear surface 218 of the device wafer 200.

Figure 4:
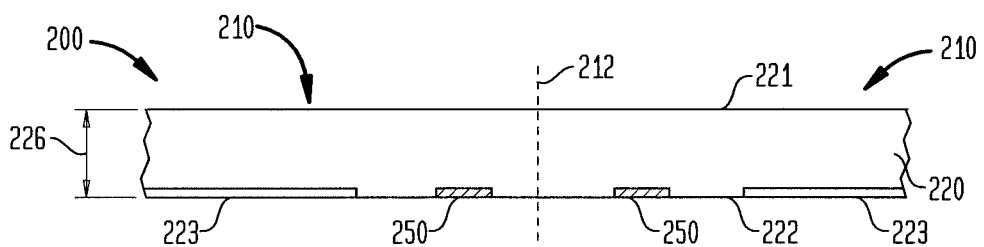
FIG. 4 is a sectional view illustrating a stage in a method of fabrication in accordance with an embodiment of the invention.

During processing, the thickness of the device wafer 200 between the front surface 222 and the initial rear surface 218 can be reduced. Grinding, lapping, or polishing from the initial rear surface 218 or a combination thereof can be used to reduce the thickness. During this step, as an example, the initial thickness 219 of the device wafer 200 can be reduced from about 700 μm to a thickness 226 of about 130 μm or less (FIG. 4).

Figure 5A:
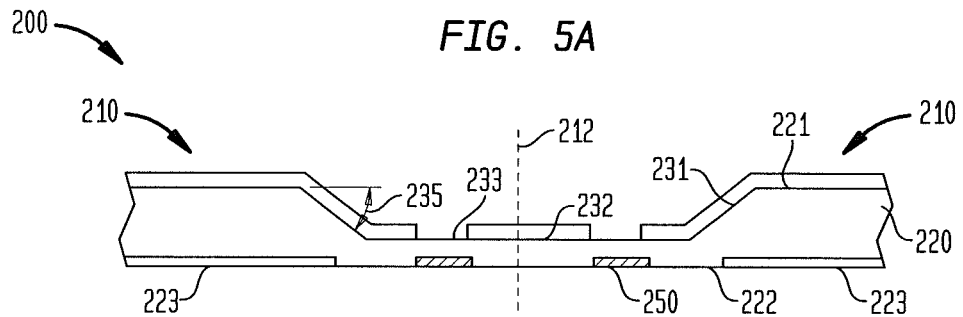
FIGS. 5A and 5B are a sectional view and a corresponding top-down plan view illustrating a stage of fabrication in accordance with an embodiment of the invention.

Then, as shown in FIG. 5A, a first opening 230 can be formed in the device wafer 200 which extends downwardly from the rear surface 221 towards the front surface 222 of the device wafer 200. The first opening 230 can be formed for example, by selectively etching the device wafer 200, after forming a mask layer where it is desired to preserve remaining portions of the rear surfaces 221 of the microelectronic units 210. For example, a photoimageable layer, e.g., a photoresist layer, can be deposited and patterned to cover only portions of the rear surface 221, after which a timed etch process can be conducted to form the first opening 230.

Each first opening 230 has a lower surface 232 which is flat and typically equidistant from the front surface 222. Inner surfaces 231 of the first opening 230, extending downwardly from the rear surface 221 towards the lower surface 232, may be sloped, i.e., may extend at angles other a normal angle (right angle) to the rear surface 221, as shown in FIG. 5A. Wet etching processes, e.g., isotropic etching processes and sawing using a tapered blade, among others, can be used to form first openings 230 having sloped inner surfaces 231. Laser dicing, mechanical milling, among others, can also be used to form first openings 230 having sloped inner surfaces 231.

Alternatively, instead of being sloped, the inner surfaces of the first opening 230 may extend in a vertical or substantially vertical direction downwardly from the rear surface 221 substantially at right angles to the rear surface 221. Anisotropic etching processes, laser dicing, laser drilling, mechanical removal processes, e.g., sawing, milling, ultrasonic machining, among others, can be used to form first openings 230 having essentially vertical inner surfaces.

Figure 5B:
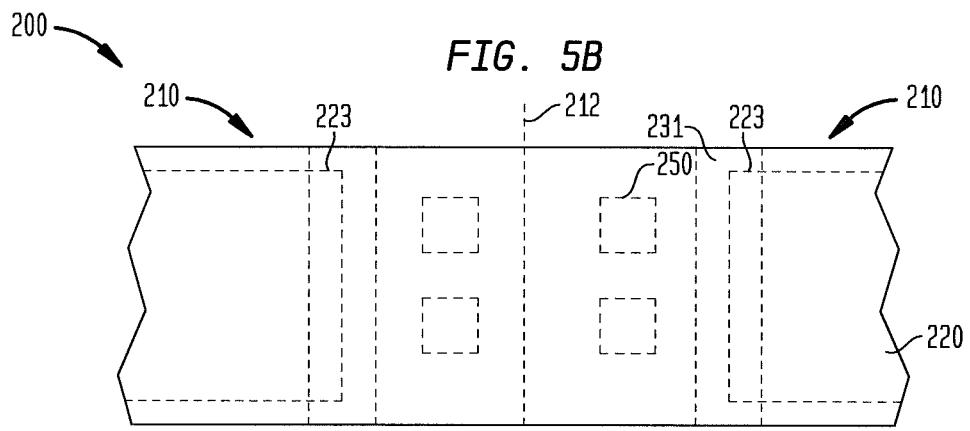

As shown in FIGS. 5A and 5B, the first opening 230 is located over four conductive pads 250 located on two microelectronic units 210, such that when the microelectronic units 210 are severed from each other along the dicing lane 212, half of the first opening 230 will be located on each microelectronic unit 210. As used herein in the specification and in the claims, the term "first opening" can refer to a first opening that is located entirely within a single microelectronic unit (e.g., as shown in FIGS. 12A and 12B), a first opening that extends across a plurality of microelectronic units 210 when it is formed (e.g., as shown in FIGS. 3A through 11B), or a portion of a first opening that is located on a particular microelectronic unit 210 after it is severed from other microelectronic units 210.

After forming the first openings 230 in the device wafer 200, a photoimageable layer such as a photoresist or a dielectric layer is deposited onto the rear surface 221 of the device wafer 200 and patterned to form mask openings 233 overlying the lower surface 232 and at least partially overlying the conductive pads 250. The mask openings 233 in the photoimageable layer or the dielectric layer are located at the desired locations for forming second openings 240 extending between the first opening 230 and bottom surfaces 251 of respective conductive pads 250.

Figure 6:
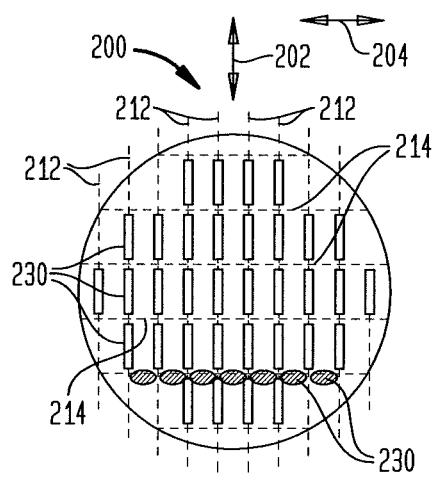
FIG. 6 is a plan view illustrating a stage of fabrication in accordance with an embodiment of the invention.

Referring now to FIG. 6, the first opening 230 can be formed as a stripe or channel extending in a vertical direction 202 over the device wafer in alignment with the dicing lane 212. As best seen in FIG. 6, elongated first openings 230 desirably are formed simultaneously which extend in a vertical direction 202 of the device wafer in alignment with vertically extending dicing lanes 212. The vertically extending first openings 230 can be formed to extend only along dicing lines 212 of respective pairs of microelectronic units 210. In such a case, the first openings 230 may not overlie corner portions of the microelectronic units 210 at intersections between the vertical dicing lanes 212 and horizontal dicing lanes 214 extending in a horizontal direction 204 of the device wafer 200. In another example, horizontally extending first openings 230 can be formed to overlie the conductive pads 250 adjacent to the horizontal dicing lanes 214 of each microelectronic unit 210. Both vertically extending first openings 230 and horizontally extending first openings 230 can be formed in the device wafer 200.

Figure 7:
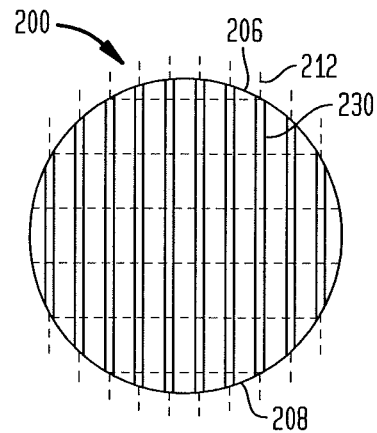
FIG. 7 is a plan view illustrating a stage of fabrication in accordance with an alternative embodiment of the invention.

In a particular example, first openings 230 may be formed which overlie the conductive pads 250 adjacent to only one of the dicing lanes 212 which bound a microelectronic unit 210. In another example, the first openings 230 can be formed which overlie only two dicing lanes 212 of the microelectronic unit 210 or which overlie only three dicing lanes 212 or more dicing lanes which bound a microelectronic unit 210. In one example, first openings 230 can be made smaller than as shown in FIG. 6, such that the first openings 230 overlie only some conductive pads 250 or rows of conductive pads 250 that lie adjacent to the dicing lanes 212 of the device wafer 200. In yet another example as illustrated in FIG. 7, first openings 230 aligned with dicing lanes 212 can extend as stripes between respective edges 206 and 208 of the device wafer 200.

Thereafter, as illustrated in FIGS. 8A and 8B, an etch process can be applied to the portions of the lower surface 232 exposed within the mask openings 233 so as to remove the semiconductor material underlying the mask openings 233. As a result, second openings 240 are formed that extend between the lower surface 232 in contact with the conductive pads 250.

The etch process can be conducted in a manner that selectively etches the semiconductor material, e.g., silicon, but preserves oxide material. Typically, the front contacts, e.g., conductive pads 250 of a semiconductor element overlie one or more layers of oxide material or other dielectric material which is used as a passivation layer to electrically isolate the semiconductor element. By etching the semiconductor material in a selective manner that preserves the dielectric, over-etching can be performed as needed to etch through the thickness of the semiconductor material in all locations of the device wafer 200 while maintaining a sufficient process window across the device wafer 200. When a selective etch process is used, the dielectric layer, e.g., oxide layer, remains in place after forming the second openings 240. Alternatively, laser drilling or mechanical milling can be used to form the second openings 240, in which case, the bottom surfaces 251 of the conductive pads 250 can be exposed within the second openings 240.

Thereafter, in the stage of fabrication illustrated in FIG. 9, a dielectric layer 225 is formed on inner surfaces 241 of the second openings 240, the inner surfaces 231 of the first openings 230, and the rear surfaces 221 of the semiconductor elements 220. Various methods can be used to form the dielectric layer 225. In one example, a flowable dielectric material is applied to the rear surface 221 of a device wafer 200 containing microelectronic units 210, and the flowable material is then more evenly distributed across the rear surface 221 of the device wafer 200 during a "spin-coating" operation, followed by a drying cycle which may include heating. In another example, a thermoplastic film of dielectric material can be applied to the rear surface 221 of the device wafer 200 after which the assembly is heated, or is heated in a vacuum environment, i.e., placed in an environment under lower than ambient pressure. This then causes the film to flow downward onto the inner surfaces 231 and the lower surfaces 232 of the first opening 230 and into the second openings 240. In another example, vapor deposition can be used to form the dielectric layer 225.

In still another example, the assembly including the device wafer 200 can be immersed in a dielectric deposition bath to form a conformal dielectric coating or dielectric layer 225. As used herein, a "conformal coating" is a coating of a particular material that conforms to a contour of the surface being coated, such as when the dielectric layer 225 conforms to a contour of the first opening 230 or the second opening 240 of the semiconductor element 220. An electrochemical deposition method can be used to form the conformal dielectric layer 225, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer 225 on exposed surfaces of the device wafer which are conductive or semiconductive, including but not limited to along the rear surfaces 221, the inner surfaces 231 and lower surface 232 of the first opening 230, and the inner surfaces 241 of the second openings 240. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on the remaining dielectric layer overlying the bottom surfaces 251 of the conductive pads 250, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 225 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C) | 5.9 (5.8-6.2) | 5.8 (5.6-5.9) | 5.4-6.0 |
| CONDUCTIVITY (25 C) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | ELECTROLAC | LECTRASEAL DV494 | LECTROBASE 101 |
|---|---|---|---|
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C) | 5.5-5.9 | 7-9 | 4.3 |
| CONDUCTIVITY (25 C) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

Then, still referring to FIG. 9, conductive vias 260 are formed within the second openings 240. The conductive vias 260 are electrically connected to the bottom surfaces 251 of the conductive pads 250 and insulated from the semiconductor element 220 by the dielectric layer 225. If prior processing results in the dielectric layer 225 obstructing the bottom surfaces 251 of the conductive pads 250, laser drilling, mechanical milling, or other appropriate techniques can be used to open the bottoms of the second openings 240 adjacent to the conductive pads 250.

In addition, if any part of a preexisting dielectric layer (e.g., a passivation layer) of the semiconductor element 220 remains in alignment with the conductive pads 250, such layer can be removed in this step. Such removal can be accomplished, for example, laser drilling, mechanical milling, or another suitable technique. Other possible removal techniques include various selective etching techniques which can be isotropic or anisotropic in nature. Anisotropic etch processes include reactive ion etch processes in which a stream of ions are directed towards surfaces to be etched. Reactive ion etch processes are generally less selective than isotropic etch processes such that surfaces at which ions strike at high angles of incidence are etched to a greater extent than surfaces which are oriented with the stream of ions. When a reactive ion etch process is used, desirably, a mask layer is desirably deposited to overlie the conformal dielectric layer 225 and openings are formed therein which are aligned with the second openings 240. In such a way, the etch process avoids removing portions of the dielectric layer 225 other than that which lies within the second openings 240.

To form the conductive vias 260, an exemplary method involves depositing a metal layer by one or more of sputtering a primary metal layer onto exposed surfaces of the assembly, plating, or mechanical deposition. Mechanical deposition can involve the directing a stream of heated metal particles at high speed onto the surface to be coated. This step can be performed by blanket deposition onto the rear surface 221, the inner surfaces 231 and the lower surfaces 232 of the first opening 230, the inner surfaces 241 of the second openings 240, and the bottom surface 251 of the conductive pads 250, for example. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the conductive vias 260. In particular examples, a stack including a plurality of metal layers can be formed on one or more of the afore-mentioned surfaces. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

Figure 10A:
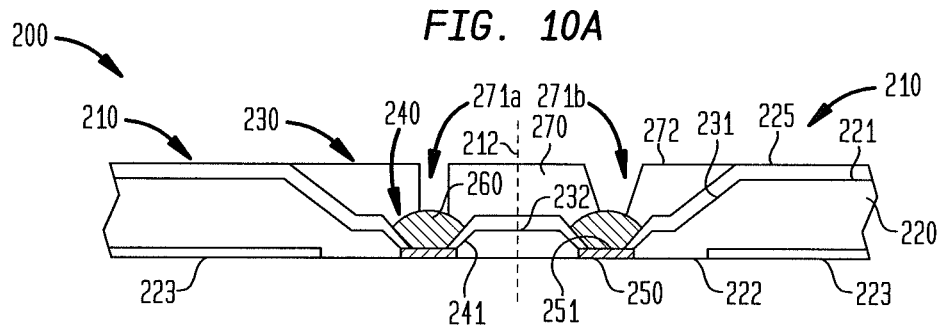
FIGS. 10A and 10B are a sectional view and a corresponding top-down plan view illustrating a stage of fabrication in accordance with an embodiment of the invention.
Figure 10B:
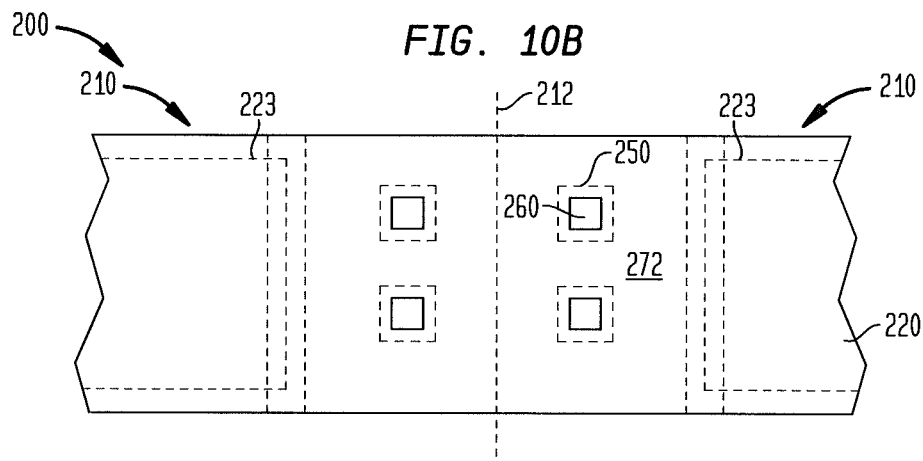

Referring to FIGS. 10A and 10B, a dielectric region 270 is formed inside the first opening 230. The dielectric region 270 can include an inorganic material, a polymeric material, or both. Optionally, the dielectric region 270 can be formed such that an exposed outer surface 272 of the region is co-planar or substantially co-planar with the rear surface 221 of the semiconductor element or the exposed surface of the dielectric layer 225. For example, a self-planarizing dielectric material can be deposited in the first opening 230, e.g., by a dispensing or stenciling process. In another example, a grinding, lapping, or polishing process can be applied to the rear surface 221 of the semiconductor element or the exposed surface of the dielectric layer 225 after forming the dielectric region 270 to planarize the surface of the dielectric region 270 to the rear surface 221 or the exposed surface of the dielectric layer 225.

In a particular embodiment, the dielectric region 270 can be compliant, having a sufficiently low modulus of elasticity and sufficient thickness such that the product of the modulus and the thickness provide compliancy. Specifically, in some embodiments (e.g., the embodiment shown and described with reference to FIG. 18) such a compliant dielectric can allow the conductive interconnect and the conductive contact attached thereto to flex or move somewhat relative to the semiconductor element when an external load is applied to the conductive contact.

Then, apertures 271a and 271b (or generally, 271) are formed, extending through the dielectric region 270 between respective conductive vias 260 and the outer surface 272 of the dielectric region 270. The apertures 271 can be formed, for example, via laser ablation, or any other appropriate method. As shown in FIG. 10A, the apertures 271 are a cylindrical shaped aperture 271a or a frusto-conical shaped aperture 271b. In other embodiments (not shown), the apertures 271 can have other shapes, including for example, a combination of a cylindrical and a frusto-conical shape at different distances from the rear surface 221.

Figure 11A:
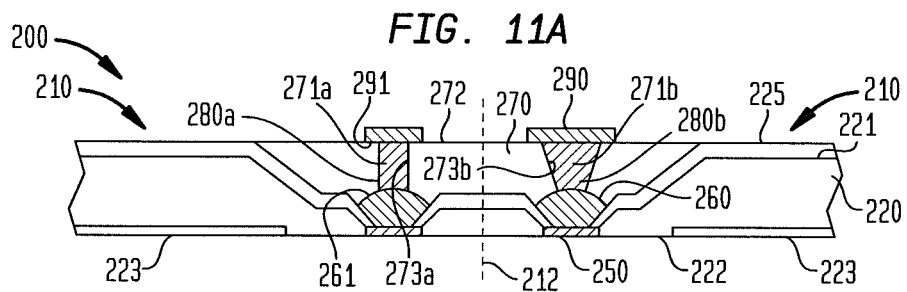
FIGS. 11A and 11B are a sectional view and a corresponding top-down plan view illustrating a stage of fabrication in accordance with an embodiment of the invention.
Figure 11B:
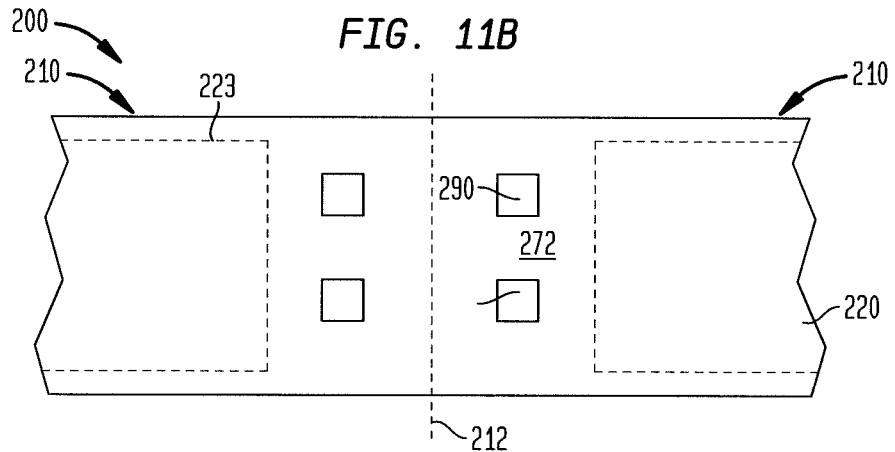
Figure 12A:
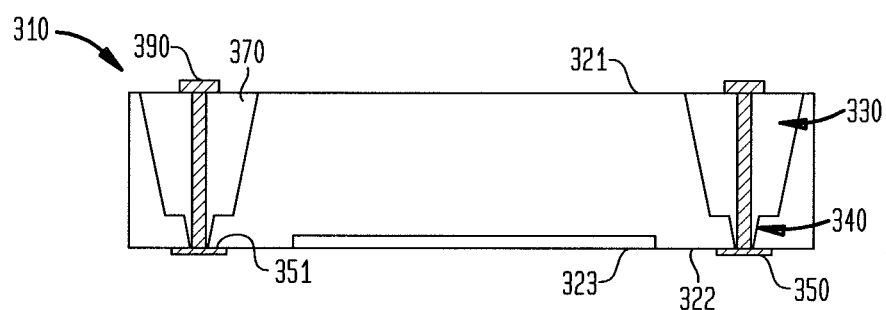
FIG. 12A is a sectional view illustrating a packaged chip in accordance with another embodiment.
Figure 12B:
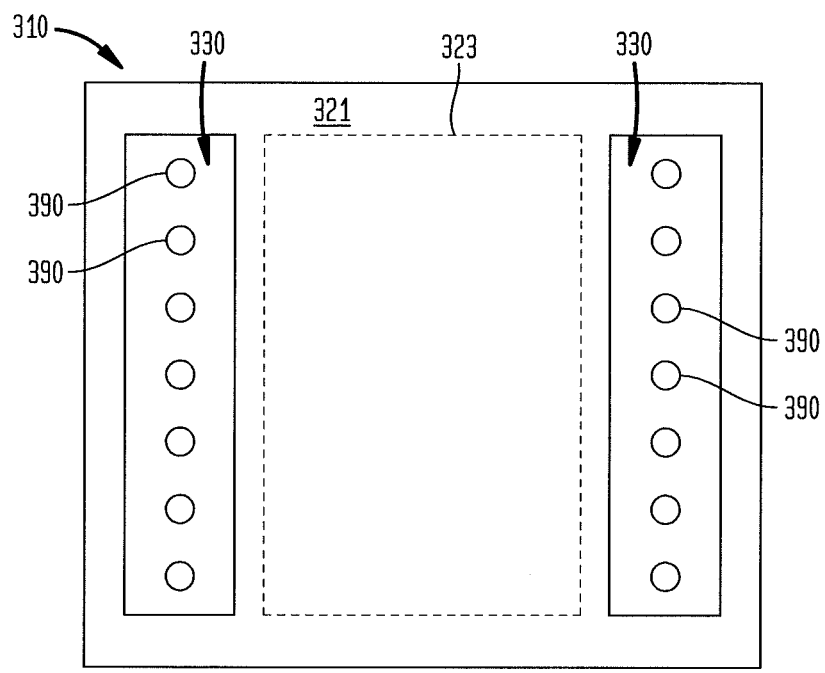
FIG. 12B is a plan view further illustrating the packaged chip shown in FIG. 12A.

Referring now to FIGS. 11A and 11B, the conductive interconnects 280a and 280b (or generally, 280) are formed within the respective apertures 271a and 271b. The conductive interconnects 280 are electrically connected to upper surfaces 261 of respective conductive vias 260 and insulated from the semiconductor element 220 by the dielectric region 270 and the dielectric layer 225. To form the conductive interconnects 280, an exemplary method involves electroless deposition. This step can be performed by blanket deposition onto the inner surfaces 273a and 273b of the respective apertures 271a and 271b, for example, such that the shape of each conductive interconnect 280a (conical) and 280b (frusto-conical) conforms to a contour of the respective inner surface 273a and 273b. As shown in FIG. 11A, the conductive interconnects 280a and 280b are solid. In other embodiments (not shown), each conductive interconnect 280 can include an internal space that is filled with a dielectric material.

Then, the conductive contacts 290 are formed. The conductive contacts 290 are exposed at an outer surface 272 of the dielectric region 270 for interconnection to an external element. The conductive contacts 290 are electrically connected to respective conductive interconnects 280 at the bottom surfaces 291 thereof. In some embodiments, the conductive interconnects 280 and the conductive contacts 290 can be formed during a single electroless deposition step. In other embodiments, the conductive interconnects 280 and the conductive contacts 290 can be formed by separate electroless deposition steps.

In one embodiment, the primary metal layer that comprises the conductive interconnects 280 and/or the conductive contacts 290 includes or consists essentially of aluminum. In another particular embodiment, the primary metal layer includes or consists essentially of copper. In yet another embodiment, the primary metal layer includes titanium. One or more other exemplary metals can be used in a process to form the conductive interconnects 280 and/or the conductive contacts 290.

Finally, the microelectronic units 210 are severed from each other along dicing lane 212 by sawing or other dicing method to form individual microelectronic units 210 as illustrated in FIGS. 11A-11B. A variety of exemplary processes for severing device wafers into individual units are described in the herein incorporated commonly owned U.S. Provisional Application Nos. 60/761,171 and 60/775,086, any of which can be used to sever the device wafers to form individual microelectronic units 210 as shown in FIGS. 11A-11B.

FIGS. 12A and 12B illustrate a microelectronic unit in accordance with another embodiment of the invention. The microelectronic unit 310 is similar to the microelectronic unit 110 described above and shown in FIG. 2, but the microelectronic unit 310 differs in the location of the first openings 330 and the second openings 340 within the microelectronic unit.

Rather than having a first opening located in the center of the microelectronic unit and active semiconductor regions of the semiconductor element located towards the periphery of the microelectronic unit, the microelectronic unit 310 includes a plurality of first openings 330, each located towards a periphery of the microelectronic unit 310, and the active semiconductor regions 323 are located towards the center of the microelectronic unit 310.

In this embodiment, each first opening 330 is in the form of a channel extending over a row of individual second openings 340, with each second opening 340 extending toward the bottom surface 351 of a conductive pad 350. In other embodiments (not shown), each first opening 330 can extend to a single respective second openings 340 that extends to a single conductive pad 350.

As shown in FIG. 12B, each first opening 330 extends across most of the length of the microelectronic unit 310. In other embodiments, a single first opening 330 can extend across the length of a wafer, traversing a plurality of microelectronic units 310, such as in the embodiment shown in FIG. 7. The thickness of the microelectronic units 310 while it is in wafer form can be reduced from its original thickness prior to performing steps to form the microelectronic units 310 shown in FIGS. 12A and 12B.

Figure 13A:
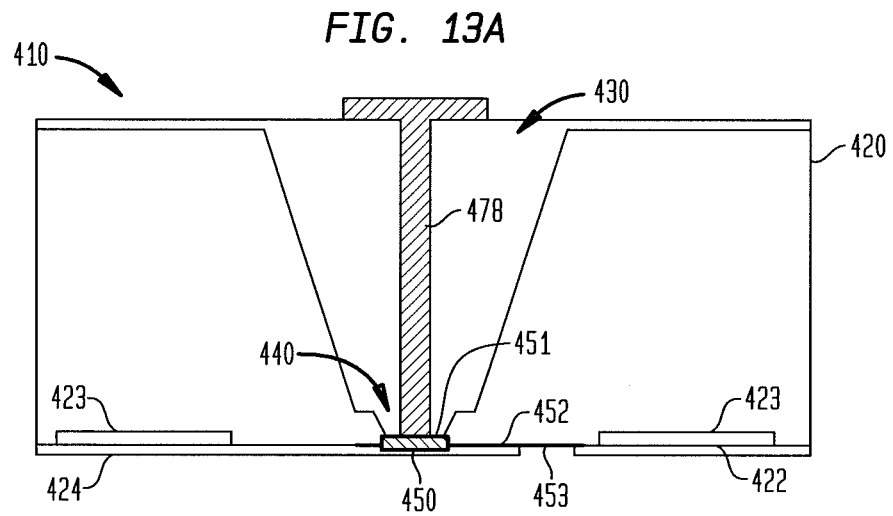
FIG. 13A is a sectional view illustrating a packaged chip in accordance with another embodiment.
Figure 13B:
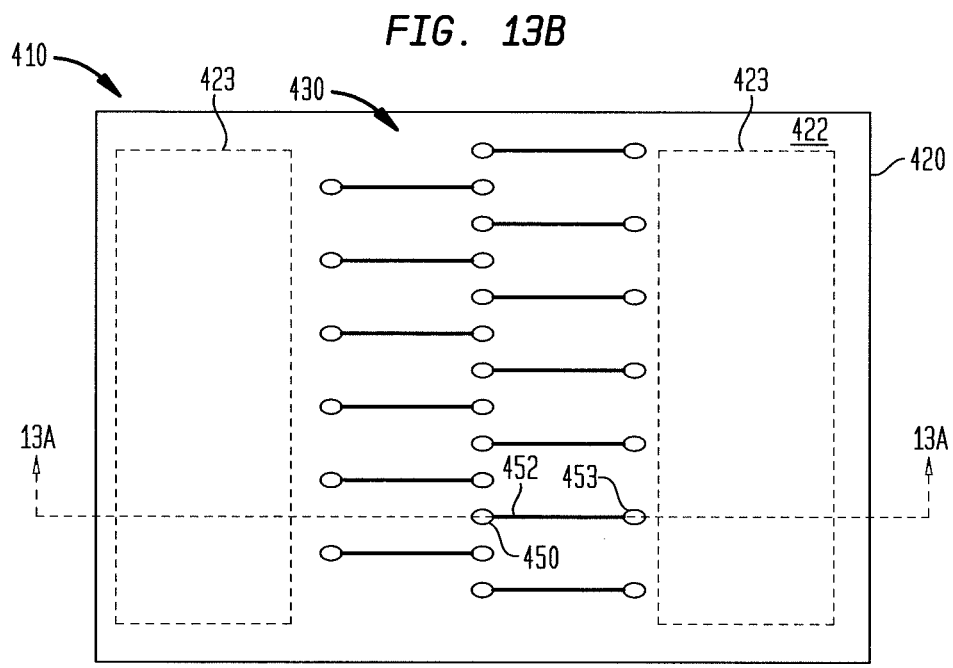
FIG. 13B is a plan view further illustrating the packaged chip shown in FIG. 13A.

FIGS. 13A and 13B illustrate a microelectronic unit in accordance with another embodiment of the invention. The microelectronic unit 410 is similar to the microelectronic unit 110 described above and shown in FIG. 2, but the microelectronic unit 410 differs in that the conductive elements 450, e.g., pads, at the front surface 422, to which conductive interconnects 478 are electrically connected, can be covered by a dielectric layer 424 such as a solder mask. The conductive elements 450, e.g., pads or traces, can be electrically connected with external conductive pads 453 that are exposed at the front surface 422 of the semiconductor element 420, and that may be exposed within openings in a dielectric layer 424.

Also, as can be seen in FIG. 13B, the microelectronic unit 410 can have a channel-shaped first opening 430 that is located in the center of the microelectronic unit, and the active semiconductor regions 423 are located towards the periphery of the microelectronic unit 410. Each conductive element 450 is connected to a respective external conductive pad 453 via a conductive trace 452.

In this embodiment, each first opening 430 can be in the form of a channel extending over a row of individual second openings 440, with each second opening 440 extending toward the bottom surface 451 of a conductive element 450. In other embodiments (not shown), each first opening 430 can extend to a single respective second opening 440 that extends to a single conductive element 450.

Figure 14:
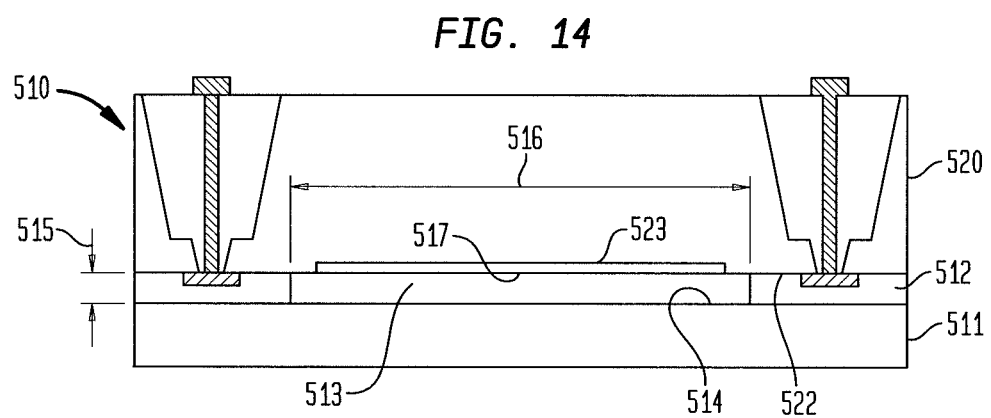
FIG. 14 is a sectional view illustrating a packaged chip including a lid member in accordance with another embodiment.

FIG. 14 is a sectional view illustrating a microelectronic element including a lid member in accordance with another embodiment. The microelectronic unit 510 is similar to the microelectronic unit 310 described above and shown in FIGS. 12A and 12B, but the microelectronic unit 510 differs in that the microelectronic element therein is connected to a lid 511 through one or more standoff structures 512, which may include an adhesive, an inorganic or organic material, and/or a joining metal.

Structures for supporting a lid at a constant spacing from a chip are described in the commonly owned U.S. Provisional Application No. 60/761,171 filed on Jan. 23, 2006, and U.S. Provisional Application No. 60/775,086 filed on Feb. 21, 2006, the disclosures of which are hereby incorporated herein by reference.

The microelectronic unit 510 can include an interior cavity 513 between the front surface 522 of the chip and the inner surface 514 of the lid 511, as illustrated in FIG. 14. Alternatively, the microelectronic unit 510 can be constructed without an interior cavity. When the cavity is present, the cavity's height 515 and the lateral dimensions, including lateral dimension 516, are typically determined, for example, by the height and dimensions of the structure used to assemble the lid 511 with the semiconductor element 520.

In a particular embodiment, the lid 511 consists essentially of a glass or polymeric material and is at least partially transparent to electromagnetic spectra at frequencies or wavelengths of interest. For example, when the microelectronic unit 510 is an optical image sensor, the lid 511 can be transparent to visible light. The lid 511 may be only partially transparent to provide a filter function, or may be essentially transparent to a range of frequencies or wavelengths of interest. In another embodiment, the lid 511 need not be transparent to light or electromagnetic spectra (e.g., when the microelectronic unit 510 is a MEMS device).

The active semiconductor devices in the active semiconductor region 523 in the microelectronic unit 510 typically include electromagnetic transducer devices such as electromagnetic or electro-optic devices which either detect or output electromagnetic radiation. The active semiconductor devices may be designed to emit or receive radio frequency and/or optical wavelengths of infrared, visible and/or ultraviolet or higher wavelength spectra including but not limited to x-ray wavelengths. For example, the active semiconductor devices may include an image sensor, or an emitter of light such as a light-emitting diode ("LED"), among others. Alternatively, the active semiconductor devices can include acoustic transducer devices, such devices being designed to convert sound pressure waves received through a medium, e.g., air and/or other fluid medium (gas or liquid) to one or more electrical signals, or to convert one or more electrical signals into sound pressure waves. In particular examples, the active semiconductor devices can include micro-electromechanical devices ("MEMs"), among which are surface acoustic wave ("SAW") devices, and accelerometers, among others. In some examples, the active semiconductor devices can include radio-frequency devices such as antennas, inductors, filters, etc.

In a particular embodiment, the packaged chip is a sensor unit in which the active semiconductor devices of the microelectronic unit 510 include an imaging area 517 for capturing an image. Electronic circuits (not shown) in the semiconductor element 520 are connected to the active semiconductor devices in the imaging area 517 for generating one or more electrical signals representing an image captured by the imaging area 517. Numerous electrical circuits are well known in the imaging art for this purpose. For example, the microelectronic unit 510 may include a charge-coupled device (CCD) imaging chip that includes clocking and charge-to-voltage conversion circuits.

Figure 15:
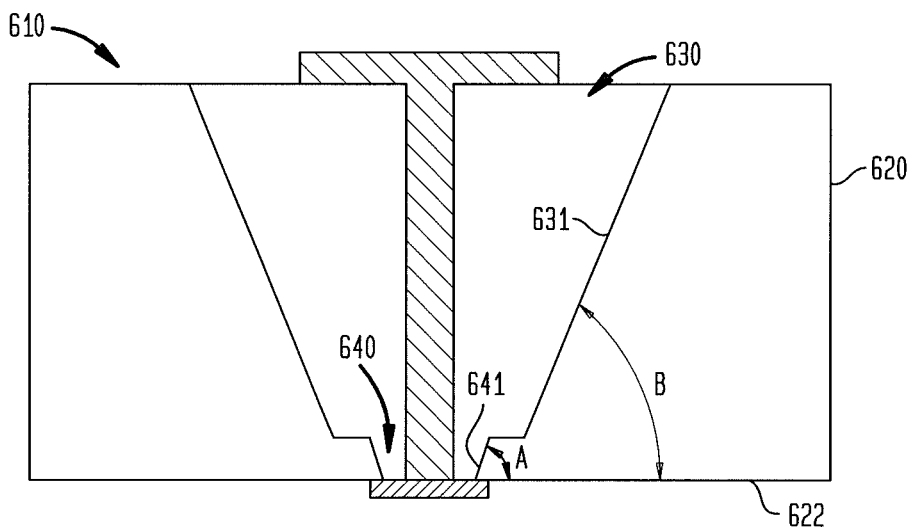
FIG. 15 is a sectional view illustrating a via structure in accordance with an embodiment of the invention.

FIG. 15 illustrates a microelectronic unit in accordance with another embodiment of the invention. The microelectronic unit 610 is similar to the microelectronic unit 110 described above and shown in FIG. 2, but the microelectronic unit 610 illustrates how the angle B made by the inner surface 631 of the first opening 630 relative to the front surface 622 of the semiconductor element 620 can be different than the angle A made by the inner surface 641 of the second opening 640 relative to the front surface 622.

The inner surface 631 of the first opening 630 can have a constant slope or a varying slope. For example, the angle B or slope of the inner surface 631 relative to the horizontal plane defined by the front surface 622 can decrease as the inner surface 631 penetrates further towards the front surface 622.

The inner surface 641 of the second opening 640 can also have a constant slope or a varying slope. For example, the angle A or slope of the inner surface 641 relative to the horizontal plane defined by the front surface 622 can decrease in magnitude (become less positive or less negative) as the inner surface 641 penetrates further towards the front surface 622.

For example, in embodiments where the first opening 630 and/or the second opening 640 is formed by a wet etching process, the etching angle can be, for example, approximately 55 degrees.

Figure 16:
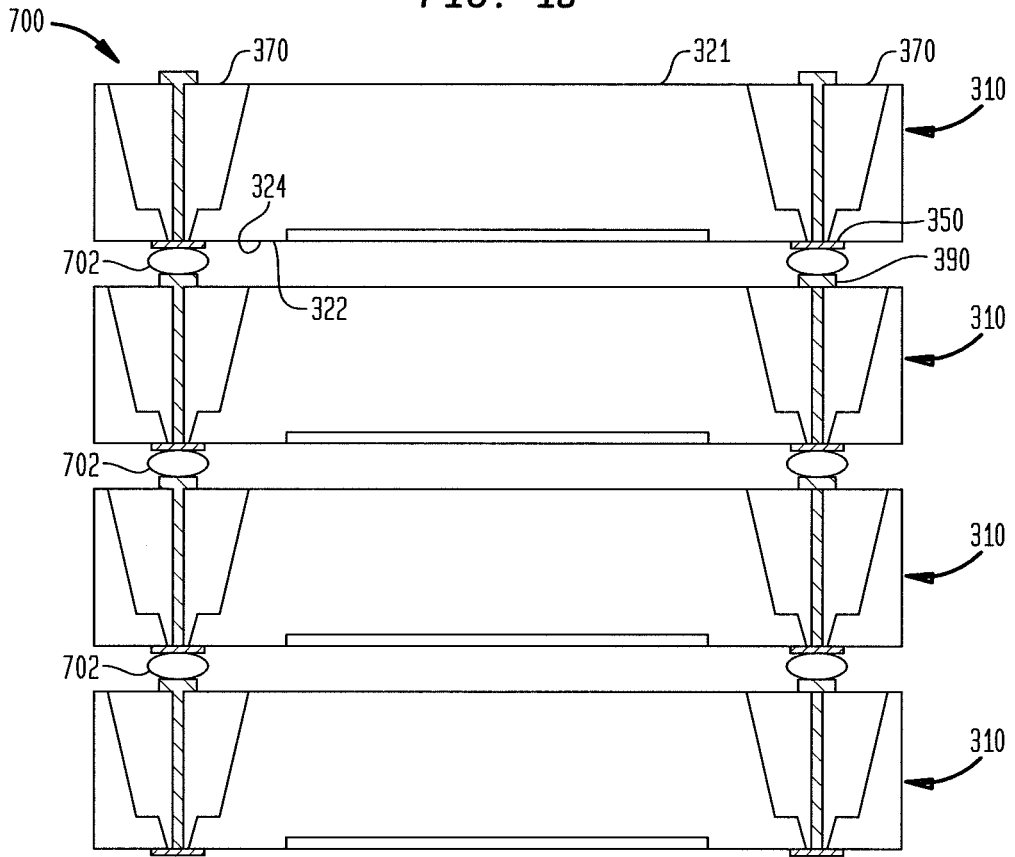
FIG. 16 is a sectional view illustrating a stacked assembly including a plurality of the packaged chips as shown in FIG. 12A.

FIG. 16 is a sectional view illustrating a stacked assembly including a plurality of the microelectronic units as shown in FIG. 12A. In the embodiment shown, a stacked assembly 700 includes a plurality of microelectronic units 310. Although FIG. 16 includes a plurality of microelectronic units 310 as shown in FIG. 12A, any of the microelectronic units disclosed herein can be stacked to form a stacked assembly.

By providing front surface conductive pads 350 and rear surface conductive contacts 390 in each microelectronic unit 310, several microelectronic units 310 can be stacked one on top of the other to form a stacked assembly 700 of microelectronic units 310. In such arrangement, the front surface conductive pads 350 are aligned with the rear surface conductive contacts 390. Connection between respective adjacent ones of the microelectronic units in the stacked assembly is through conductive masses 702. The dielectric layer 324 (e.g., the external passivation layer) on the front surface 322 and the dielectric region 370 on the rear surface 321 provide electrical isolation between adjacent microelectronic units 310 in the stacked assembly 700 except where interconnection is provided.

The stacked assembly 700 can include a plurality of conductive masses 702 joining the conductive pads 350 of an upper microelectronic unit 310 with the conductive contacts 390 of a lower microelectronic unit 310. The conductive masses 702 can comprise a fusible metal having a relatively low melting temperature, e.g., solder, tin, or a eutectic mixture including a plurality of metals. Alternatively, the conductive masses 702 can include a wettable metal, e.g., copper or other noble metal or non-noble metal having a melting temperature higher than that of solder or another fusible metal. Such wettable metal can be joined with a corresponding feature, e.g., a fusible metal feature of an interconnect element such as a circuit panel to externally interconnect the microelectronic unit 310 to such interconnect element. In a particular embodiment, the conductive masses 702 can include a conductive material interspersed in a medium, e.g., a conductive paste, e.g., metal-filled paste, solder-filled paste or isotropic conductive adhesive or anisotropic conductive adhesive.

Figure 17:
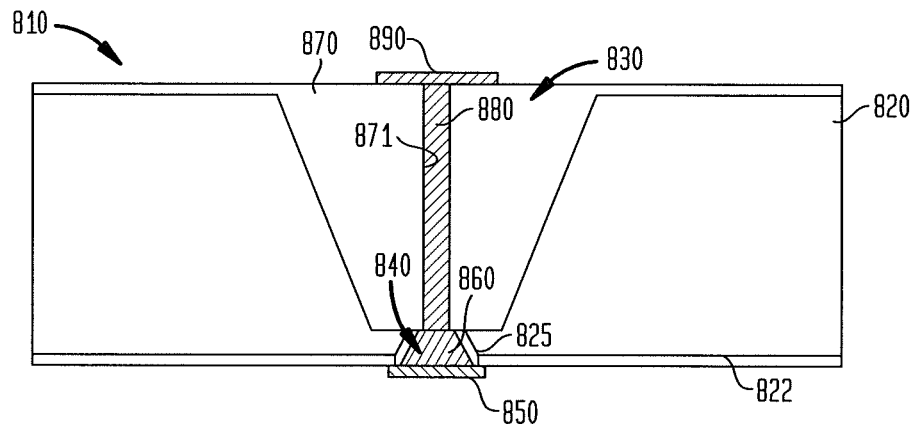
FIG. 17 is a sectional view illustrating an interposer via structure in accordance with an embodiment of the invention.

FIGS. 17 through 22B illustrate various interposer via structures in accordance with embodiments of the invention. FIG. 17 illustrates an interconnection substrate in accordance with another embodiment. The interconnection substrate 810 is similar to the microelectronic unit 10 described above with reference to FIG. 1, but the interconnection substrate 810 differs in that the interconnection substrate 810 need not contain an active semiconductor region.

Because there is no active semiconductor region in the interconnection substrate 810, the second opening 840 can be created, e.g., via etching, from the front surface 822 without risking damage to the chip. Also, rather than having the conductive pads provided on the front surface 822, the conductive pads 850 can be formed after forming the second opening 840.

To fabricate the interconnection substrate 810, in one example, the second opening 840 can be created first and then coated with a dielectric layer 825 and filled with a conductive via 860. The first opening 830 can then be created and filled with a dielectric region 870. An aperture 871 can be created through the dielectric region 870 and then filled with a conductive interconnect 880. Finally, a conductive pad 850 can be attached to the conductive via 860, and a conductive contact 890 can be attached to the conductive interconnect 880. Alternatively, the first opening 830 can be created first, after which the second opening 840 can be created. Forming of the conductive via 860 can be done either before or after the conductive interconnect 880 is formed.

Figure 18:
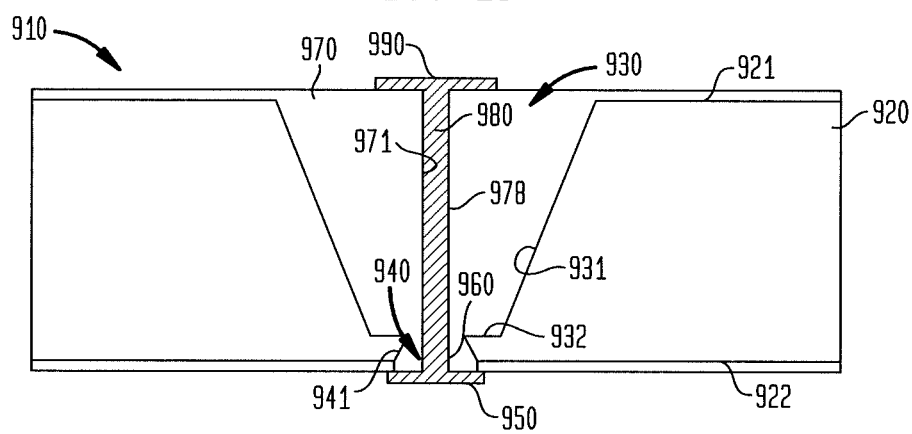
FIG. 18 is a sectional view illustrating an interposer via structure in accordance with an alternate embodiment.

FIG. 18 illustrates an interconnection substrate in accordance with another embodiment. The interconnection substrate 910 is similar to the interconnection substrate 810 described above with reference to FIG. 17, but the interconnection substrate 910 differs in the structure of the dielectric region and in the configuration of the electrical connection between the conductive pad and the conductive contact.

Rather than having a separate conductive interconnect and conductive via, the interconnection substrate 910 includes a single unitary conductive interconnect 978 extending between the conductive pad 950 and the conductive contact 990. The conductive interconnect 978 includes a conductive interconnect portion 980 extending from the conductive pad 950 through the first opening 930 and a conductive via portion 960 extending from the conductive contact 990 through the second opening 940.

Rather than having a dielectric layer coating the inner surface 941 of the second opening 940 and a separate dielectric region filling the space between the inner surface 931 of the first opening 930 and the conductive interconnect 978, the interconnection substrate 910 includes a single unitary dielectric region 970 coating the inner surface 931 of the first opening 930, the inner surface 941 of the second opening 940, and the rear surface 921 of the semiconductor element 120. The dielectric region 970 also fills the space between the inner surfaces 931 and 941 and the conductive interconnect 978.

To form the single conductive interconnect 978, the dielectric region 970 can be applied inside the first opening 930 and the second opening 940. An aperture 971 can be created extending completely through the dielectric region 970, for example via laser ablation. The aperture 971 can be metalized, e.g., plated with a metal, a conductive compound of a metal, or both. In an example, the metal can be copper, gold, or both, or be metalized by a process other than plating, such as by sputtering, application of a fusible metal, e.g., solder, or otherwise. The conductive interconnect 978 can be solid or can be in the form of a conductive coating lining an inner surface of the aperture 971. The conductive coating can define an internal space, which in one example can be empty, can be covered with a dielectric material, or can be filled with a dielectric material.

The dielectric region 970 can be compliant, having a sufficiently low modulus of elasticity and sufficient thickness such that the product of the modulus and the thickness provide compliancy. Specifically, the dielectric region 970 can allow the conductive interconnect 978 and the conductive contact 990 and the conductive pad 950 attached thereto to flex or move somewhat relative to the semiconductor element 920 when an external load is applied to the conductive contact 990 or the conductive pad 950. In that way, the bond between the conductive contacts 990 or the conductive pads 950 of the interconnection substrate 910 and terminals of a circuit panel (not shown) can better withstand thermal strain due to mismatch of the coefficient of thermal expansion ("CTE") between the interconnection substrate 910 and the circuit panel.

In one embodiment, the degree of compliancy provided by the product of the thickness of the dielectric region 970 and its modulus of elasticity can be sufficient to compensate for strain applied to the conductive contacts 990 or the conductive pads 950 due to thermal expansion mismatch between the interconnection substrate 910 and a substrate to which the microelectronic unit is mounted through the conductive contacts 990 or the conductive pads 950. An underfill (not shown) can be provided between the exposed surface of the dielectric region 970 and such circuit panel to enhance resistance to thermal strain due to CTE mismatch.

Figure 19:
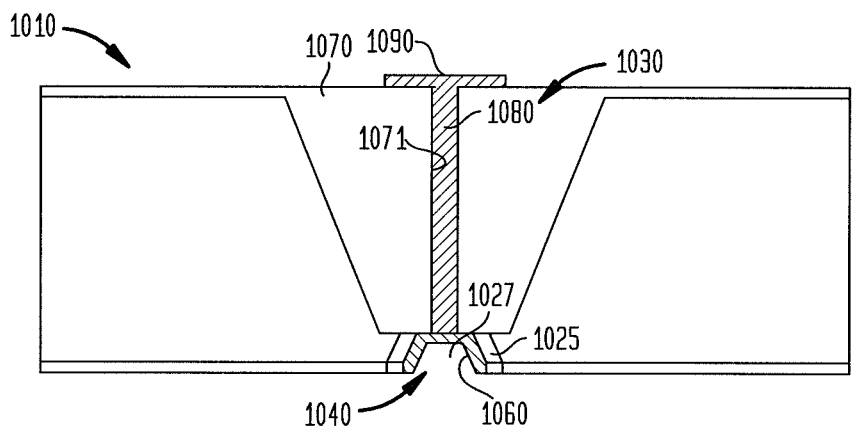
FIG. 19 is a sectional view illustrating an interposer via structure in accordance with another alternate embodiment.

FIG. 19 illustrates an interconnection substrate in accordance with another embodiment. The interconnection substrate 1010 is similar to the interconnection substrate 810 described above with reference to FIG. 17, but the interconnection substrate 1010 differs in the configuration of the conductive via 1060.

In one example, rather than having a conductive via that fully fills the space inside of the second opening 1040 that is not occupied by the dielectric layer 1025, the conductive via 1060 can be deposited as a metallic layer onto the dielectric layer 1025, such that an internal space 1027 is created inside the conductive via 1060.

To fabricate the interconnection substrate 1010, for example, the second opening 1040 can be created first and then coated with a dielectric layer 1025 and a conductive metal can be deposited onto the dielectric layer 1025 to create a conductive via 1060. The first opening 1030 can then be created, e.g., by etching, laser ablation, mechanical milling, etc., such that an upper surface 1061 of the conductive via 1060 is exposed. The first opening 1030 can then be filled with a dielectric region 1070. An aperture 1071 can be created through the dielectric region 1070 and then filled with a conductive interconnect 1080. Finally, a conductive pad can be attached to the conductive via 1060, and a conductive contact 1090 can be attached to the conductive interconnect 1080.

Figure 20A:
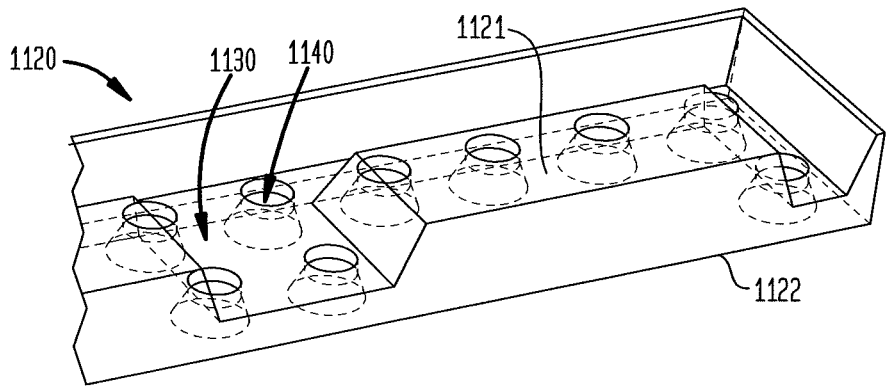
FIG. 20A is a perspective view illustrating a via structure including a channel-shaped opening coupled to a plurality of smaller openings in accordance with another embodiment.

FIG. 20A is a perspective view illustrating an interconnection substrate including a channel-shaped first opening that meets a plurality of smaller second openings in accordance with another embodiment. The semiconductor element 1120 is similar to the semiconductor elements 820, 920, and 1020 shown and described with respect to FIGS. 17-19, but the semiconductor element 1120 has channel-shaped first openings 1130, each first opening 1130 being coupled to a plurality of second openings 1140.

Figure 20B:
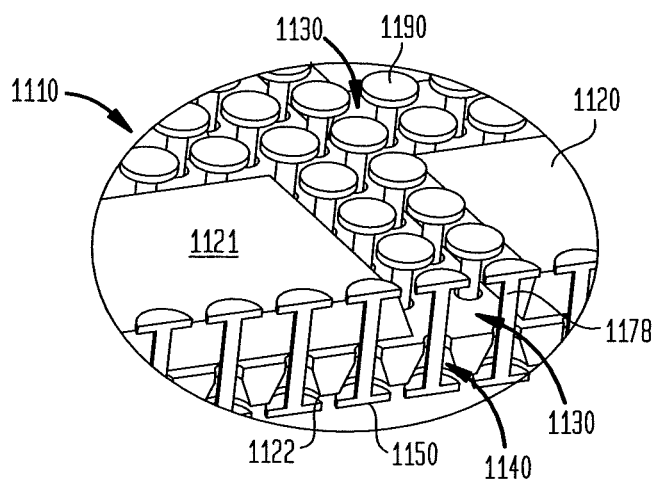
FIG. 20B is a perspective view illustrating the via structure depicted in FIG. 20A further including conductive bond pads and metallic interconnection elements.
Figure 20C:
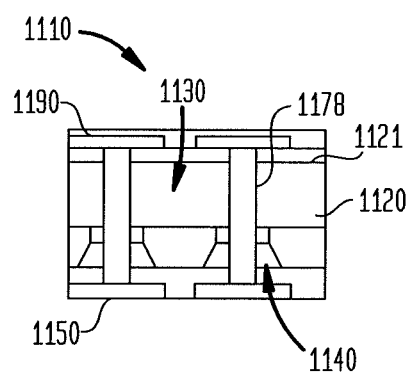
FIG. 20C is a partial sectional view illustrating a portion of the via structure depicted in FIG. 20B, the section taken through line 20C-20C of FIG. 20B.

FIGS. 20B and 20C illustrate the semiconductor element 1120 depicted in FIG. 20A further including conductive bond pads and metallic interconnection elements. The interconnection substrate 1110 shown in FIGS. 20B and 20C includes the semiconductor element 1120 shown in FIG. 20A that has channel-shaped first openings 1130, each first opening 1130 coupled to a plurality of second openings 1140. The interconnection substrate 1110 further includes a plurality of conductive interconnects 1178, each conductive interconnect 1178 coupled to a conductive pad 1150 at the front surface 1122 of the semiconductor element 1120 and a conductive contact 1190 at the rear surface 1121 of the semiconductor element 1120.

It can be seen in FIGS. 20B and 20C that the structure and arrangement of each first opening 1130, second opening 1140, conductive interconnect 1178, conductive pad 1150, and conductive contact 1190 is similar to the structure and arrangement shown and described above with reference to FIG. 18.

Figure 21:
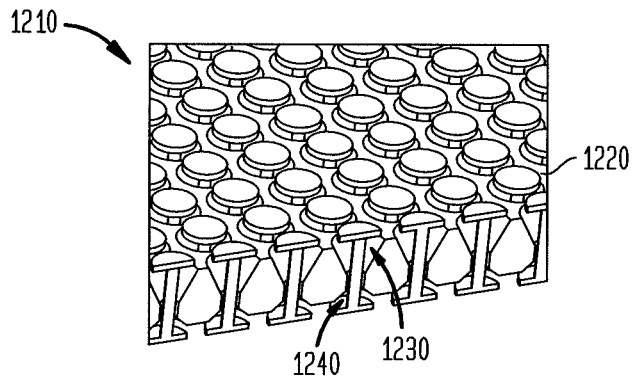
FIG. 21 is a perspective view illustrating a portion of an interposer in accordance with another embodiment.

FIG. 21 is a perspective view illustrating a portion of an interposer in accordance with an embodiment. The interconnection substrate 1210 is similar to the interconnection substrate shown and described with respect to FIGS. 20B and 20C, but the semiconductor element 1220 has round first openings 1230, each first opening 1230 meeting a single second opening 1240.

Figure 22A:
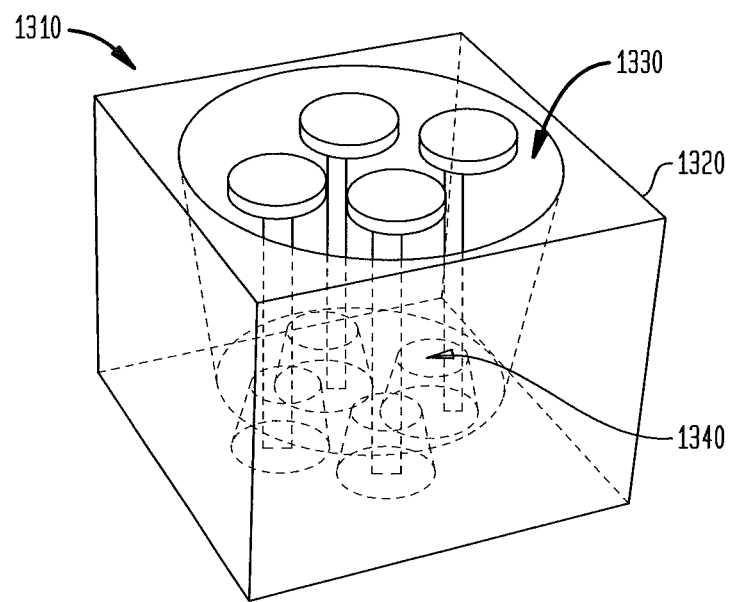
FIGS. 22A and 22B are a perspective view and a perspective sectional view illustrating a via structure including a single large opening and a plurality of smaller openings in accordance with another embodiment.
Figure 22B:
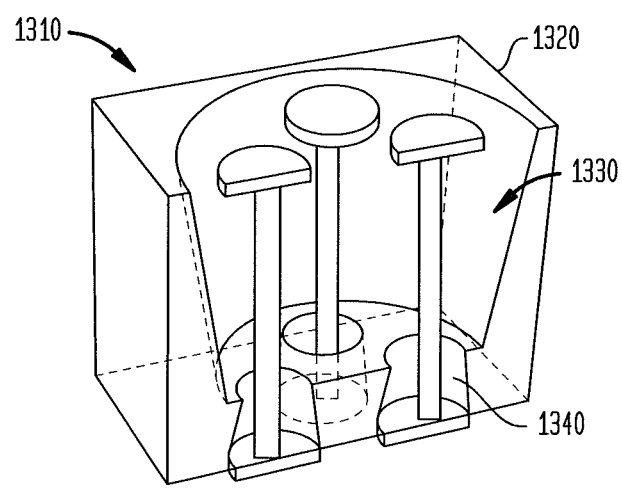

FIGS. 22A and 22B are a perspective view and a perspective sectional view illustrating an interconnection substrate structure including a single large opening and a plurality of smaller openings in accordance with another embodiment.

The interconnection substrate 1310 is similar to the interconnection substrate shown and described with respect to FIGS. 20B and 20C, but the semiconductor element 1320 has round first openings 1330, each first opening 1330 meeting four second openings 1340, arranged in a cluster-like configuration.

Figure 23:
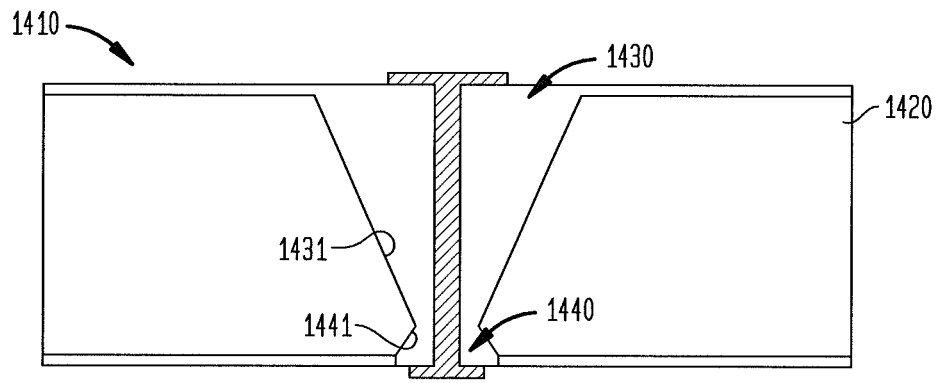
FIG. 23 is a sectional view illustrating an interposer via structure in accordance with an embodiment of the invention.

FIG. 23 illustrates an interconnection substrate in accordance with another embodiment. The interconnection substrate 1410 is similar to the interconnection substrate 910 described above with reference to FIG. 18, but the interconnection substrate 1410 differs in the structure of the semiconductor element 1420 at the interface between the first opening 1430 and the second opening 1440.

Rather than having a lower surface 932 of the first opening 930 that is flat and typically equidistant from the front surface 922 as shown in FIG. 18, the semiconductor element 1420 does not have such a lower surface of the first opening 1430. Instead, the first opening 1430 has an inner surface 1431 having a lower diameter that is equal or approximately equal to an upper diameter of an inner surface 1441 of the second opening 1440.

Figure 24:
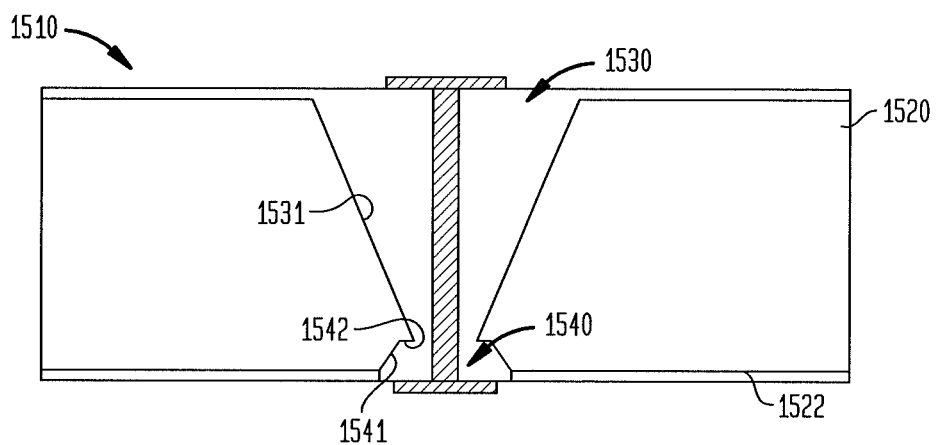
FIG. 24 is a sectional view illustrating an interposer via structure in accordance with an alternate embodiment.

FIG. 24 illustrates an interconnection substrate in accordance with another embodiment. The interconnection substrate 1510 is similar to the interconnection substrate 910 described above with reference to FIG. 18, but the interconnection substrate 1510 differs in the structure of the semiconductor element 1520 at the interface between the first opening 1530 and the second opening 1540.

Rather than having a lower surface 932 of the first opening 930 that is flat and typically equidistant from the front surface 922 as shown in FIG. 18, the semiconductor element 1520 does not have such a lower surface of the first opening 1530. Instead, the first opening 1530 has an inner surface 1531 having a lower diameter that is less than an upper diameter of an inner surface 1541 of the second opening 1540, such that the inner surface 1541 meets an upper surface 1542 of the second opening 1540 that is flat and equidistant from the rear surface 1522.

Figure 25:
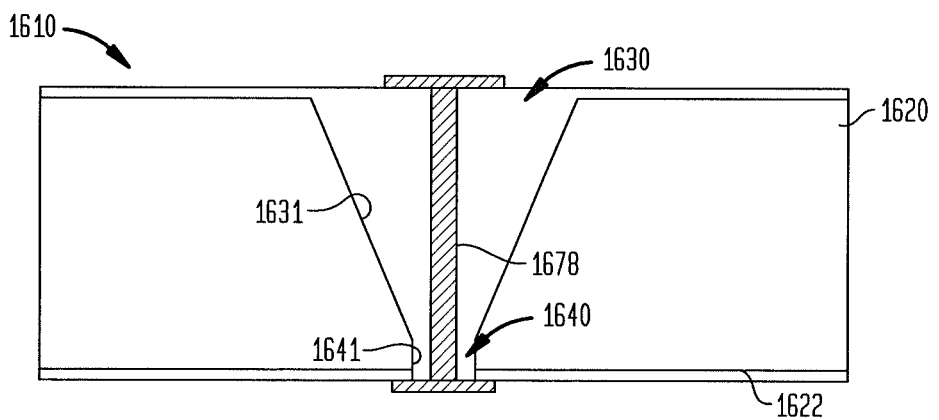
FIG. 25 is a sectional view illustrating a via structure in accordance with an embodiment of the invention.

FIG. 25 illustrates a microelectronic unit in accordance with another embodiment. The microelectronic unit 1610 is similar to the microelectronic unit 110 described above with reference to FIG. 2, but the microelectronic unit 1610 differs in the structure of the semiconductor element 1620 at the interface between the first opening 1630 and the second opening 1640, and the second opening 1640 has a different shape.

Rather than having a lower surface 132 of the first opening 130 that is flat and typically equidistant from the front surface 122 as shown in FIG. 2, the semiconductor element 1620 does not have such a lower surface of the first opening 1630. Instead, the first opening 1630 has an inner surface 1631 having a lower diameter that is equal or approximately equal to an upper diameter of an inner surface 1641 of the second opening 1640. As shown, the inner surface 1641 has a cylindrical shape (i.e., a constant or approximately constant diameter), but in other embodiments, the inner surface 1641 may increase or decrease in diameter as a function of the distance from the front surface 1622.

Figure 26:
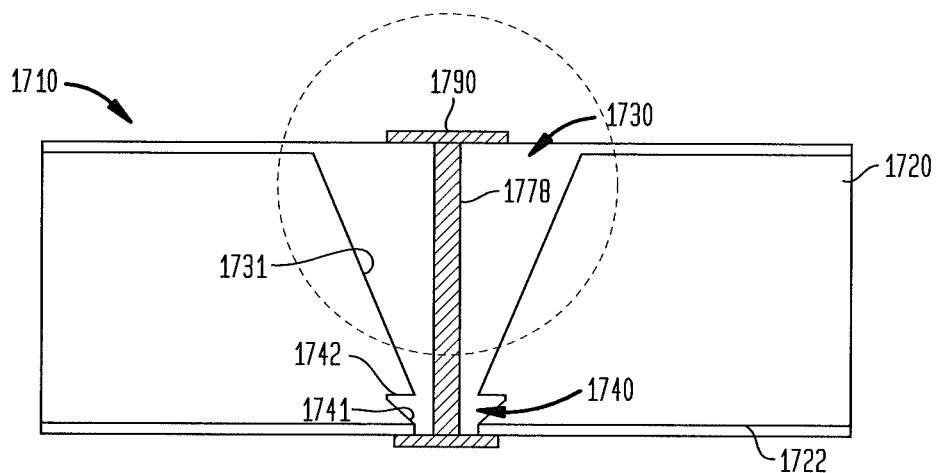
FIG. 26 is a sectional view illustrating a via structure in accordance with an alternate embodiment.

FIG. 26 illustrates a microelectronic unit in accordance with another embodiment. The microelectronic unit 1710 is similar to the microelectronic unit 110 described above with reference to FIG. 2, but the microelectronic unit 1710 differs in the structure of the semiconductor element 1720 at the interface between the first opening 1730 and the second opening 1740.

Rather than having a lower surface 132 of the first opening 130 that is flat and typically equidistant from the front surface 122 as shown in FIG. 2, the semiconductor element 1720 does not have such a lower surface of the first opening 1730. Instead, the first opening 1730 has an inner surface 1731 having a lower diameter that is less than an upper diameter of an inner surface 1741 of the second opening 1740, such that the inner surface 1741 meets an upper surface 1742 of the second opening 1740 that is flat and equidistant from the front surface 1722.

Figure 27:
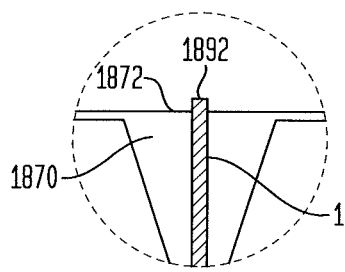
FIGS. 27-29 are partial sectional views illustrating embodiments of conductive interconnects that are not attached to contact pads.
Figure 28:
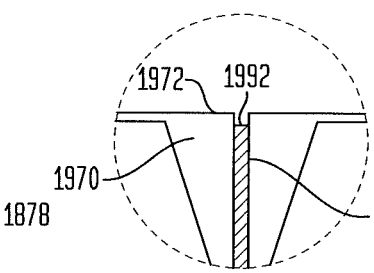
Figure 29:
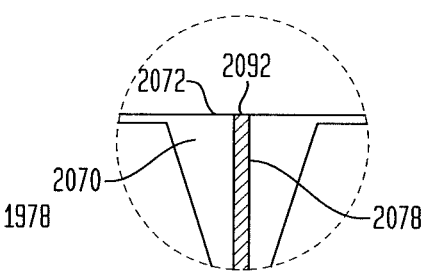

FIGS. 27-29 are partial sectional views illustrating embodiments of conductive interconnects that are not attached to contact pads. These padless conductive interconnect embodiments can be incorporated into any of the other embodiments disclosed herein that include a conductive interconnect. For example, any of the padless conductive interconnect embodiments can replace the conductive interconnect 1778 shown in FIG. 26, without using the conductive pad 1790.

For example, as shown in FIGS. 27-29, respective conductive interconnects 1878, 1978, and 2078 are not connected to respective contact pads at respective top surfaces 1892, 1992, and 2092. Instead, the top surfaces 1892, 1992, and 2092 of the respective conductive interconnects 1878, 1978, and 2078 are exposed at respective outer surfaces 1872, 1972, and 2072 of respective dielectric regions 1870, 1970, and 2070.

In the embodiment shown in FIG. 27, the top surface 1892 of the conductive interconnect 1878 extends above the outer surface 1872 of the dielectric region 1870 (i.e., at a greater distance from the front surface of the semiconductor element). In the embodiment shown in FIG. 28, the top surface 1992 of the conductive interconnect 1978 is recessed below the outer surface 1972 of the dielectric region 1970 (i.e., at a smaller distance from the front surface of the semiconductor element). In the embodiment shown in FIG. 29, the top surface 2092 of the conductive interconnect 2078 is level with or approximately level with the outer surface 2072 of the dielectric region 2070 (i.e., at the same or approximately the same distance from the front surface of the semiconductor element).

In such padless embodiments, an external element can be interconnected to the top surfaces 1892, 1992, and 2092 of the respective conductive interconnects 1878, 1978, and 2078, rather than being interconnected to a conductive pad that is connected to the respective conductive interconnects 1878, 1978, and 2078. For example, an external element can be connected to the top surfaces 1892, 1992, and 2092 by a conductive mass (e.g., tin or solder), anodic bonding, diffusion from a thermal compression process, an adhesive, or direct oxide bonding. In particular embodiments, the top surfaces 1892, 1992, and 2092 of the respective conductive interconnects 1878, 1978, and 2078 can serve as conductive contacts exposed for interconnection with an external element.

Figure 30:
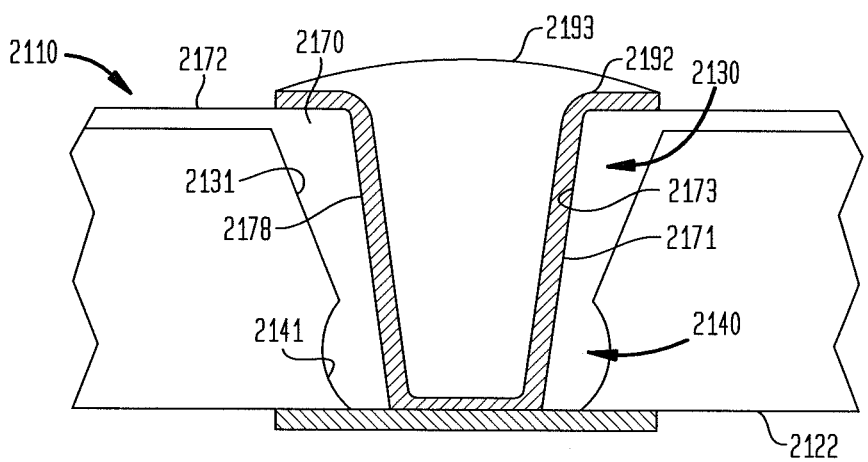
FIG. 30 is a sectional view illustrating a via structure in accordance with an embodiment of the invention.

FIG. 30 is a sectional view illustrating a via structure in accordance with an embodiment of the invention. The microelectronic unit 2110 is similar to the microelectronic unit 1610 described above with reference to FIG. 25, but the microelectronic unit 2110 differs in the structure of the conductive interconnect 2178 extending through the first opening 2130 and the second opening 2140, and the second opening 2140 has a different shape.

As in the microelectronic unit 1610 shown in FIG. 25, the first opening 2130 of the microelectronic unit 2110 has an inner surface 2131 having a lower diameter that is equal or approximately equal to an upper diameter of an inner surface 2141 of the second opening 2140. As shown, the inner surface 2141 has a bulbous shape (i.e., a non-linearly varying diameter), but in other embodiments, the inner surface 2141 may increase or decrease in diameter as a linear function of the distance from the front surface 2122, or the inner surface 2141 may have a constant or approximately constant diameter.

Rather than having a unitary conductive interconnect 1678 as shown in FIG. 25, the microelectronic unit 2110 has a conductive interconnect 2178 that can be formed by plating an inner surface 2173 of an aperture 2171 that extends through a dielectric region 2170, thereby producing a conductive layer overlying the inner surface 2173 of the aperture 2171. In such embodiments, the conductive interconnect 2178 need not conform to the shape of the first opening 2130 (i.e., to the contour of the inner surface 2131 of the first opening) or conform to the shape of the second opening 2140 (i.e., to the contour of the inner surface 2141 of the second opening).

As shown in FIG. 30, the conductive interconnect 2178 is plated on the inner surface 2173 of the aperture 2171 and on the top surface 2172 of the dielectric region 2170, such that the conductive interconnect 2178 extends through the aperture 2171 and out onto the top surface 2172 of the dielectric region 2170.

As shown, the conductive interconnect 2178 can be filled with a conductive mass 2193 that can comprise a fusible metal having a relatively low melting temperature, e.g., solder, tin, or a eutectic mixture including a plurality of metals. Alternatively, the conductive mass 2193 can include a wettable metal, e.g., copper or other noble metal or non-noble metal having a melting temperature higher than that of solder or another fusible metal.

As shown, the conductive mass 2193 fills the entire volume inside of the conductive interconnect 2178 and extends out onto top surfaces 2192 of the conductive interconnect 2178. In other embodiments (not shown), the conductive mass 2193 can extend to a height from the front surface 2122 equal to that of the top surfaces 2192, such that the conductive mass 2193 only fills the volume inside of the conductive interconnect 2178 and does not extend out onto the top surfaces 2192. In yet another embodiment, the conductive mass may only partially fill the volume inside the conductive interconnect.

In one embodiment (not shown), the conductive interconnect 2178 can remain hollow (e.g., be filled with air). In another embodiment (not shown), the conductive interconnect 2178 can be coated with, or alternatively filled with a dielectric material.

Figure 31:
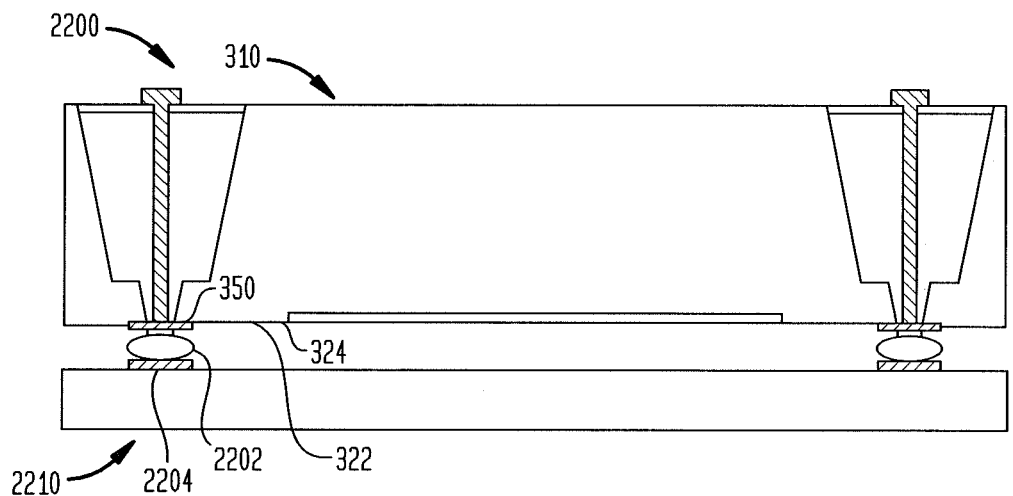
FIG. 31 is a sectional view illustrating a packaged chip including a substrate in accordance with another embodiment.

FIG. 31 is a sectional view illustrating a packaged chip including a substrate in accordance with another embodiment. In the embodiment shown, a microelectronic assembly 2200 includes a microelectronic unit 310 as shown in FIG. 12A joined to a substrate 2210. Although FIG. 31 includes a microelectronic unit 310 as shown in FIG. 12A, any of the microelectronic units disclosed herein can be joined with a substrate.

In such arrangement, connection between the microelectronic unit 310 and the substrate 2210 is through the conductive masses 2202. The front surface conductive pads 350 are aligned with conductive contacts 2204 of the substrate 2210. The dielectric layer 324 (e.g., the external passivation layer) on the front surface 322 provides electrical isolation between the microelectronic unit 310 and the substrate 2210 except where interconnection is provided.

The conductive masses 2202 can comprise a fusible metal having a relatively low melting temperature, e.g., solder, tin, or a eutectic mixture including a plurality of metals. Alternatively, the conductive masses 2202 can include a wettable metal, e.g., copper or other noble metal or non-noble metal having a melting temperature higher than that of solder or another fusible metal. In a particular embodiment, the conductive masses 2202 can include a conductive material interspersed in a medium, e.g., a conductive paste, e.g., metal-filled paste, solder-filled paste or isotropic conductive adhesive or anisotropic conductive adhesive.

The methods disclosed herein for forming via structures in semiconductor elements can be applied to a microelectronic substrate, such as a single semiconductor chip, or can be applied simultaneously to a plurality of individual semiconductor chips which can be held at defined spacings in a fixture or on a carrier for simultaneous processing. Alternatively, the methods disclosed herein can be applied to a microelectronic substrate or element including a plurality of semiconductor chips which are attached together in form of a wafer or portion of a wafer to perform processing as described above simultaneously with respect to a plurality of semiconductor chips on a wafer-level, panel-level or strip-level scale.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory.

Figure 32:
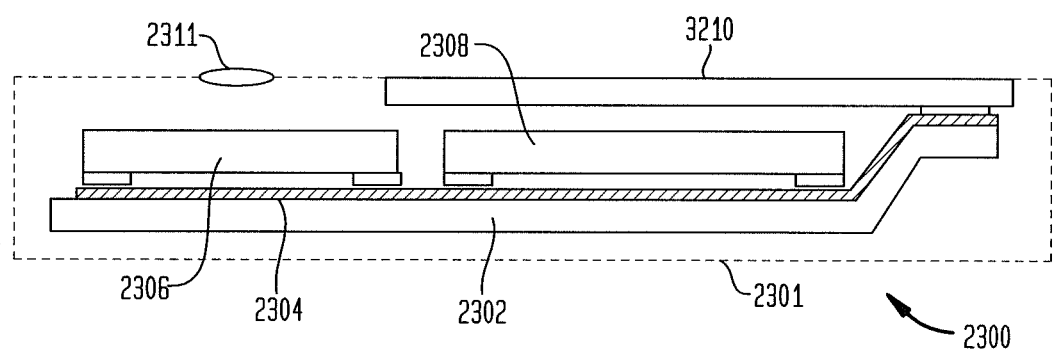
FIG. 32 is a schematic depiction of a system according to one embodiment of the invention.

The structures discussed above can be utilized in construction of diverse electronic systems. For example, a system 2300 in accordance with a further embodiment of the invention includes a structure 2306 as described above in conjunction with other electronic components 2308 and 2310. In the example depicted, component 2308 is a semiconductor chip whereas component 2310 is a display screen, but any other components can be used. Of course, although only two additional components are depicted in FIG. 32 for clarity of illustration, the system may include any number of such components. The structure 2306 as described above may be, for example, a microelectronic unit as discussed above in connection with FIG. 1A, or a structure incorporating plural microelectronic units as discussed with reference to FIG. 16. In a further variant, both may be provided, and any number of such structures may be used.

Structure 2306 and components 2308 and 2310 are mounted in a common housing 2301, schematically depicted in broken lines, and are electrically interconnected with one another as necessary to form the desired circuit. In the exemplary system shown, the system includes a circuit panel 2302 such as a flexible printed circuit board, and the circuit panel includes numerous conductors 2304, of which only one is depicted in FIG. 32, interconnecting the components with one another. However, this is merely exemplary; any suitable structure for making electrical connections can be used.

The housing 2301 is depicted as a portable housing of the type usable, for example, in a cellular telephone or personal digital assistant, and screen 2310 is exposed at the surface of the housing. Where structure 2306 includes a light-sensitive element such as an imaging chip, a lens 2311 or other optical device also may be provided for routing light to the structure. Again, the simplified system shown in FIG. 32 is merely exemplary; other systems, including systems commonly regarded as fixed structures, such as desktop computers, routers and the like can be made using the structures discussed above.

The vias and via conductors disclosed herein can be formed by processes such as those disclosed in greater detail in the co-pending, commonly assigned U.S. patent application Ser. Nos. 12/842,587, 12/842,612, 12/842,651, 12/842,669, and 12/842,692, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic unit, comprising:

a semiconductor element having a front surface and a rear surface remote from the front surface, a plurality of active semiconductor devices therein, and a plurality of conductive pads, each conductive pad having a top surface exposed at the front surface and having a bottom surface remote from the top surface, the semiconductor element having a first opening extending from the rear surface partially through the semiconductor element towards the front surface, and at least one second opening, each second opening extending from the first opening to at least the bottom surface of a respective one of the conductive pads;

at least one conductive via extending within a respective one of the at least one second opening and being electrically connected with the respective conductive pad;

a dielectric region overlying an inner surface of the semiconductor element in the first opening, the dielectric region having an aperture extending through the dielectric region from the conductive via to an exposed surface of the dielectric region, wherein a contour of the aperture does not conform to a contour of the first opening, wherein the dielectric region is compliant, having a sufficiently low modulus of elasticity and sufficient thickness such that the product of the modulus and the thickness provide compliancy;

at least one conductive interconnect electrically connected to a respective conductive via, the at least one conductive interconnect extending within the aperture through the dielectric region from the conductive via to the exposed surface of the dielectric region, the at least one conductive interconnect defining an outer surface having a shape that does not conform to a shape of the inner surface of the semiconductor element in the first opening; and at least one conductive contact exposed for interconnection with an external element, the conductive contact being electrically connected to a respective conductive interconnect, the at least one conductive contact being aligned in a vertical direction with a portion of the semiconductor element within the first opening, the vertical direction being a direction of a thickness of the semiconductor element between the front and rear surfaces, the at least one conductive contact being deposited in direct contact with the exposed surface of the dielectric region and wholly disposed within an area defined by edges of the first opening in a lateral direction along the rear surface, wherein the at least one conductive contact is moveable relative to the front surface of the semiconductor element when an external load is applied to the at least one conductive contact.

2. A microelectronic unit as claimed in claim 1, wherein the aperture has at least one of cylindrical or frusto-conical shape.

3. A microelectronic unit as claimed in claim 1, wherein a single active semiconductor region contains the plurality of active semiconductor devices.

4. A microelectronic unit as claimed in claim 1, wherein each of a plurality of active semiconductor regions contains a subset of the plurality of active semiconductor devices.

5. A microelectronic unit as claimed in claim 1, wherein the first opening has a first width in a lateral direction along the rear surface, and at least one of the conductive contacts has a second width in the lateral direction, the first width being greater than the second width.

6. A microelectronic unit as claimed in claim 1, wherein a plurality of the conductive interconnects extend within a particular first opening and a plurality of the vias extend within respective second openings which meet the particular first opening and electrically connect ones of the conductive interconnects to respective conductive pads exposed at the semiconductor element front surface.

7. A microelectronic unit as claimed in claim 6, wherein the first opening has a width in a first lateral direction along the rear surface, and the first opening has a length in a second lateral direction along the rear surface transverse to the first lateral direction, the length being greater than the width.

8. A microelectronic unit as claimed in claim 7, wherein the first opening defines a channel shape.

9. A microelectronic unit as claimed in claim 6, wherein the first opening is a plurality of first openings, each of at least some of the first openings having a single aperture and a single conductive interconnect extending therein.

10. A microelectronic unit as claimed in claim 1, wherein the conductive contact includes a thin flat member.

11. A microelectronic unit as claimed in claim 1, further comprising a conductive bond material exposed at a surface of the conductive contact.

12. A microelectronic assembly as claimed in claim 11, further comprising a substrate having a substrate contact thereon, the substrate contact being conductively joined with the conductive contact.

13. A microelectronic unit as claimed in claim 11, further comprising a polymeric layer overlying the dielectric region and separating respective areas of the bond material.

14. A microelectronic unit as claimed in claim 1, wherein the at least one conductive contact has a surface exposed above a plane defined by the rear surface.

15. A microelectronic unit as claimed in claim 14, wherein the surface of the dielectric region extends above a plane defined by the rear surface.

16. A microelectronic unit as claimed in claim 1, wherein the second opening has a width at the bottom surface of the conductive pad which exceeds a width of the second opening where the first and second openings meet.

17. A microelectronic unit as claimed in claim 1, wherein a second aperture extending within a dielectric layer within the second opening does not conform to a contour of the second opening and the via does not conform to the contour of the second opening.

18. A microelectronic unit as claimed in claim 1, wherein the conductive interconnect includes a conductive layer overlying an inner surface within the aperture and a dielectric layer overlying the conductive layer within the aperture.

19. A microelectronic unit as claimed in claim 1, wherein the aperture is a first aperture, and the second opening includes a second dielectric region overlying an inner surface thereof, the second dielectric region having a second aperture, and the at least one via extends within the second aperture.

20. A microelectronic unit as claimed in claim 19, wherein the second aperture has at least one of cylindrical or frusto-conical shape.

21. A microelectronic unit as claimed in claim 19, wherein a width of the first aperture defines a step change relative to a width of the second aperture where the first and second apertures meet.

22. A microelectronic unit as claimed in claim 1, wherein each conductive pad at least partially overlies a respective one of the conductive vias.

23. A microelectronic unit as claimed in claim 1, wherein each conductive via is contacting the bottom surface of a respective one of the conductive pads.

24. A microelectronic unit as claimed in claim 1, wherein the second opening has an upper surface opposite the bottom surface of the conductive pad and an inner surface extending between the upper surface of the second opening and the bottom surface of the conductive pad, and the second opening has an upper diameter where the upper surface and the inner surface meet that exceeds a width of the first opening where the first and second openings meet.

25. A microelectronic unit as claimed in claim 1, further comprising a lid member attached to the front surface of the semiconductor element.

26. A microelectronic assembly including at least first and second microelectronic units, each microelectronic unit being as claimed in claim 1, the first microelectronic unit being stacked with the second microelectronic unit, with the semiconductor elements therein being electrically connected to each other.

27. A system comprising a structure according to claim 1 and one or more other electronic components electrically connected to the structure.

28. A system as claimed in claim 27, further comprising a housing, said structure and said other electronic components being mounted to said housing.

29. A microelectronic unit as claimed in claim 1, wherein at least a portion of the bottom surface of the respective conductive pad is exposed within the second opening, and the at least one conductive via is deposited in contact with the bottom surface of the respective conductive pad.

* * * * *